(12) United States Patent
Jang et al.

(10) Patent No.: US 7,566,954 B2
(45) Date of Patent: Jul. 28, 2009

(54) BONDING CONFIGURATIONS FOR LEAD-FRAME-BASED AND SUBSTRATE-BASED SEMICONDUCTOR PACKAGES

(75) Inventors: Kyung Lae Jang, Seongnam-Si (KR); Hee Seok Lee, Hwasung-Si (KR); Heung Kyu Kwon, Seongnam-Si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 11/084,529

(22) Filed: Mar. 18, 2005

(65) Prior Publication Data

US 2006/0017142 A1  Jan. 26, 2006

(30) Foreign Application Priority Data

Jul. 24, 2004 (KR) ............. 10-2004-0058070

(51) Int. Cl.
*H01L 23/495* (2006.01)
(52) U.S. Cl. ........... 257/676; 257/E23.07; 257/E23.043
(58) Field of Classification Search ............ 257/E23.07, 257/E23.043
See application file for complete search history.

(56) References Cited

U.S. PATENT DOCUMENTS

| | | | |
|---|---|---|---|
| 4,999,700 A * | 3/1991 | Dunaway et al. | 257/666 |
| 5,898,213 A | 4/1999 | Torres et al. | 257/666 |
| 5,923,092 A | 7/1999 | Kang | 257/786 |
| 5,952,710 A | 9/1999 | Kobayashi | 257/666 |
| 5,969,416 A | 10/1999 | Kim | |
| 6,608,376 B1 | 8/2003 | Liew et al. | |
| 7,132,735 B2 * | 11/2006 | Diberardino et al. | 257/676 |
| 2002/0121682 A1 | 9/2002 | Azcarate et al. | 257/675 |
| 2002/0140083 A1 | 10/2002 | Matsuda | 257/711 |

FOREIGN PATENT DOCUMENTS

| | | |
|---|---|---|
| CN | 1212461 A | 3/1999 |
| DE | 197 04 343 | 2/1997 |
| EP | 0 015 111 | 12/1982 |
| JP | 62-185331 | 8/1987 |
| JP | 10-12792 | 1/1998 |

* cited by examiner

*Primary Examiner*—Howard Weiss
(74) *Attorney, Agent, or Firm*—Mills & Onello, LLP.

(57) ABSTRACT

In a bonding configuration for a semiconductor device package, the bonding angles of the bonding wires are maintained within acceptable limits, without causing an increase in the chip die size, and without necessitating the use of the corner rule. In this manner, the occurrence of shorting between adjacent bonding wires can be mitigated or eliminated, and device net die count during fabrication can be increased.

16 Claims, 17 Drawing Sheets

BONDING CONFIGURATIONS FOR LEAD-FRAME-BASED AND SUBSTRATE-BASED SEMICONDUCTOR PACKAGES

RELATED APPLICATIONS

The application claims priority to Korean patent application 2004-58070, filed Jul. 24, 2004, the contents of which are incorporated herein by reference.

BACKGROUND OF THE INVENTION

The number of transistors that can be formed on an integrated circuit chip continues to increase with the trend toward higher integration. Accordingly, integrated circuits become more sophisticated and demand an increased number of input and output I/O terminals or leads. Therefore, the number of bonding pads placed at the edges of the chip die likewise increases, which places constraints on the chip packaging.

In an integrated circuit die, the bonding pads are commonly placed at the perimeter of the chip. The die is mounted to a lead frame or package substrate, which in turn contains a number of pins or leads for distributing the signals from the bonding pads of the die to a circuit panel to which the chip package is mounted. The lead frame or package substrate includes a number of leads that are generally aligned with the bonding pads of the chip die. The leads are coupled to the bonding pads by bonding wires.

FIG. 1 is a plan view of a conventional bonding configuration. Chip die 1 includes a plurality of bonding pads 3 along an edge of the die 1. The bonding pads 1 are coupled to a plurality of corresponding leads 5 of a lead frame by bonding wires 7 at bonding regions 9 of the lead frame. The bonding regions 9 are also commonly referred to as "inner lead tips", for lead frames, or "bonding fingers", for package substrate configurations. The leads 5 are larger in size than the corresponding bonding pads 3. The angle at which the bonding wire 7 lies relative to an axis that is normal to the edge of the die 1 passing through the corresponding pad 3 is referred to as a "bonding angle". Bonding wires 7 coupled to bonding pads 3 in a central region of the edge of the chip are spaced apart by a distance S2, while bonding wires 7 coupled to bonding pads 3 in a corner region of the edge of the chip are spaced apart by a distance S1. The distance S1 between the bonding wires in the corner regions of the die is less than the distance S2 between the bonding wires in the central region of the die because of the increased bonding angle of the wires in the corner regions owing to the larger size of the leads 5. With the reduced distance S1 between wires in the corner regions, there is an increased likelihood of shorting between bonding wires in the corner regions during the final stages of chip packaging, a costly time at which to introduce defects in the fabrication process since manufacture of the chip is nearly completed at that time.

To overcome wire-to-wire shorting in the corner regions, the spacing between bonding pads 3 is made to increase from the central regions of the die to the corner regions. FIG. 2 is a plan view of a conventional bonding configuration in which the spacing, or "pitch", between bonding pads 3 is increased in this manner. This increase in pitch is generally referred to as the "corner rule". Using the corner rule, it can be seen in FIG. 2 that the pitch P1 between bonding pads 3 in the central region is less than the pitch P2 between bonding pads 3 in an intermediate region, which, in turn, is less than the pitch P3 between bonding pads 3 in the corner region (P1<P2<P3). The corner rule applies to bonding pads both along vertical and horizontal edges of the die and in all quadrants of the die. By increasing the pitch between bonding pads in this manner, the increase in bonding angle between the chip bonding pads 3 and the lead bonding regions 9 is mitigated or eliminated. Examples of the use of the corner rule for chip bonding configurations are provided in U.S. Pat. No. 5,923,092, the contents of which are incorporated herein by reference.

However, a bonding configuration in which the corner rule is applied results in an increased chip size if the bonding pad count is to be maintained. This is contrary to design integration, and contrary to manufacturing throughput in which an optimal "net die" count, or number of chips per wafer, is desired. Accordingly device fabrication costs are proportionally increased.

SUMMARY OF THE INVENTION

The present invention is directed to a die-to-package bonding configuration in which the bonding angles of the bonding wires are maintained within acceptable limits, without causing an increase in the chip die size. Lead frames and package substrates include leads, lead bonding regions, or bonding fingers that are arranged so as to accommodate bonding pad configurations of uniform pitch, even in the corner regions of the chip die. In this manner, the occurrence of shorting between adjacent bonding wires can be mitigated or eliminated, and device net die count during fabrication can be increased.

The present invention is further directed to a connecting system, a semiconductor device package and a method of formation thereof that utilizes the bonding configurations.

In a first aspect, the present invention is directed to a connecting system for a semiconductor device package. A plurality of bonding regions are provided about a die region, the bonding regions each corresponding to a designated one of a plurality of bonding pads of a die mounted in the die region, a first set of the bonding regions being positioned along a first guide line and corresponding to a first plurality of adjacent bonding pads at a central region of an edge of the die, a second set of the bonding regions being positioned along a second guide line and corresponding to a second plurality of adjacent bonding pads at a corner region of the die, the first and second guide lines being discontinuous. A plurality of external terminals are also provided, each connected to a corresponding one of the plurality of bonding regions.

In one embodiment, the bonding regions comprise bonding fingers. The bonding fingers are formed on an outer surface of a multiple-layered substrate or multiple-layered circuit board, and a plurality of conductive vias connect each of the plurality of bonding fingers to each corresponding one of the plurality of external terminals.

In another embodiment, the bonding regions comprise bonding tips of a lead frame. Conductive leads coupled between each bonding region and a corresponding one of the plurality of external terminals. The conductive leads extend in an inward direction past the bonding tips into the die region to serve as a support for a die mounted in the die region. At least one of the conductive leads coupled to the second set of bonding regions includes a first inflection point that redirects the lead toward the central region of the edge of a die mounted in the die region and away from the corner region of the die. At least one of the conductive leads coupled to the second set of bonding regions can further include a second inflection point closer to the die region than the first inflection point that redirects the lead to be oriented in a direction toward the bonding pad corresponding to the bonding region of the conductive lead.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, a change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. The bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

In another embodiment, the bonding regions are elongated and have long axes that are oriented in a direction toward the corresponding bonding pad of a die mounted in the die region.

In another embodiment, the first set of bonding regions positioned along the first guide line and the second set of bonding regions positioned along the second guide line are located in the connecting system to correspond with an octant of the die region. In this case, each octant has a corresponding first set of bonding regions positioned along the first guide line and a corresponding second set of bonding regions positioned along the second guide line.

The semiconductor device package can comprise, for example, a number of different package types, including a ball grid array (BGA), a quad flat package (QFP) and a quad flat non-lead package (QFN).

In another aspect, the present invention is directed to a connecting system for a semiconductor device package. A plurality of bonding regions are provided about a die region, the bonding regions each corresponding to a designated one of a plurality of bonding pads of a die mounted in the die region, a first set of the bonding regions being positioned along a first guide line and corresponding to a first plurality of adjacent bonding pads at a central region of an edge of the die, a second set of the bonding regions being positioned along a second guide line and corresponding to a second plurality of adjacent bonding pads at a corner region of the die. A plurality of external terminals are provided, each connected to a corresponding one of the plurality of bonding regions. A change in a bonding angle between each one of the corresponding first plurality of adjacent bonding pads and first set of bonding regions is incremental, a change in the bonding angle between each one of the corresponding second plurality of adjacent bonding pads and second set of bonding regions is incremental, and a change in the bonding angle between a last one of the corresponding first plurality of adjacent bonding pads and first set of bonding regions and a first one of the corresponding second plurality of adjacent bonding pads and second set of bonding regions is discontinuous relative to the incremental change.

In one embodiment of this aspect, the first and second guide lines are discontinuous.

In another embodiment, the bonding regions comprise bonding fingers. The bonding fingers are formed on an outer surface of a multiple-layered substrate or multiple-layered circuit board, and a plurality of conductive vias connect each of the plurality of bonding fingers to each corresponding one of the plurality of external terminals.

In another embodiment, the bonding regions comprise bonding tips of a lead frame. Conductive leads coupled between each bonding region and a corresponding one of the plurality of external terminals. The conductive leads extend in an inward direction past the bonding tips into the die region to serve as a support for a die mounted in the die region. At least one of the conductive leads coupled to the second set of bonding regions includes a first inflection point that redirects the lead toward the central region of the edge of a die mounted in the die region and away from the corner region of the die. At least one of the conductive leads coupled to the second set of bonding regions can further include a second inflection point closer to the die region than the first inflection point that redirects the lead to be oriented in a direction toward the bonding pad corresponding to the bonding region of the conductive lead.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, the bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

In another embodiment, the bonding regions are elongated and have long axes that are oriented in a direction toward the corresponding bonding pad of a die mounted in the die region.

In another embodiment, the first set of bonding regions positioned along the first guide line and the second set of bonding regions positioned along the second guide line are located in the connecting system to correspond with an octant of the die region. In this case, each octant has a corresponding first set of bonding regions positioned along the first guide line and a corresponding second set of bonding regions positioned along the second guide line.

The semiconductor device package can comprise, for example, a number of different package types, including a ball grid array (BGA), a quad flat package (QFP) and a quad flat non-lead package (QFN).

In another aspect, the present invention is directed to a connecting system for a semiconductor device package. A plurality of bonding regions are provided about a die region. A plurality of external terminals are provided, each connected to a corresponding one of the plurality of bonding regions. A plurality of conductive leads couple corresponding bonding regions and external terminals. The bonding regions each comprise bonding tips of the conductive leads each corresponding to a designated one of a plurality of bonding pads of a die mounted in the die region, a first set of the bonding regions being positioned along a first guide line and corresponding to a first plurality of adjacent bonding pads at a central region of an edge of the die, a second set of the bonding regions being positioned along a second guide line and corresponding to a second plurality of adjacent bonding pads at a corner region of the die. At least one of the conductive leads coupled to the second set of bonding regions includes a first inflection point that redirects the lead toward the central region of the edge of a die mounted in the die region and away from the corner region of the die.

In one embodiment, the connecting system comprises a lead frame. The conductive leads lie on a plane. In another embodiment, the conductive leads extend in an inward direction past the bonding tips into the die region to serve as a support for a die mounted in the die region.

In another embodiment, at least one of the conductive leads coupled to the second set of bonding regions further includes a second inflection point closer to the die region than the first inflection point that redirects the lead to be oriented in a direction toward the bonding pad corresponding to the bonding region of the conductive lead.

In another embodiment, a change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. The bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, the first and second guide lines are positioned at different distances from the die region, and the second guide line is closer to the die region than the first guide line.

In another embodiment, the bonding regions are elongated and have long axes that are oriented in a direction toward the corresponding bonding pad of a die mounted in the die region.

In another embodiment, the first set of bonding regions positioned along the first guide line and the second set of bonding regions positioned along the second guide line are located in the connecting system to correspond with an octant of the die region. In this case, each octant has a corresponding first set of bonding regions positioned along the first guide line and a corresponding second set of bonding regions positioned along the second guide line.

The semiconductor device package can comprise, for example, a number of different package types, including a ball grid array (BGA), a quad flat package (QFP) and a quad flat non-lead package (QFN).

In another aspect, the present invention is directed to a semiconductor device package. A semiconductor device die is provided in a central die region of the package, the die including a first plurality of bonding pads at a central region of an edge of the die and a second plurality of bonding pads at a corner region of the die. A connecting system includes a plurality of bonding regions about the die region, the bonding regions each corresponding to a designated one of a plurality of the bonding pads of the die, a first set of the bonding regions positioned along a first guide line and corresponding to the first plurality of adjacent bonding pads at the central region of the die, a second set of the bonding regions positioned along a second guide line and corresponding to the second plurality of adjacent bonding pads at the corner region of the die, the first and second guide lines being discontinuous. A plurality of bonding wires are provided, each bonding wire connecting corresponding bonding regions of the connecting system and bonding pads of the die. A plurality of external terminals are provided, each connected to a corresponding one of the plurality of bonding regions.

In one embodiment, the connecting system comprises a multiple-layered substrate or multiple layered circuit board having an outer surface, and wherein the bonding regions comprise bonding fingers formed on the outer surface, and further comprises a plurality of conductive vias that connect each of the plurality of bonding fingers to each corresponding one of the plurality of external terminals.

In another embodiment, the connecting system comprises a lead frame wherein the bonding regions comprise bonding tips of the lead frame and wherein the lead frame further comprises conductive leads coupled between each bonding region and a corresponding one of the plurality of external terminals.

In another embodiment, the conductive leads extend in an inward direction past the bonding tips into the die region to serve as a support for a die mounted in the die region. At least one of the conductive leads coupled to the second set of bonding regions includes a first inflection point that redirects the lead toward the central region of the edge of a die mounted in the die region and away from the corner region of the die. At least one of the conductive leads coupled to the second set of bonding regions can further include a second inflection point closer to the die region than the first inflection point that redirects the lead to be oriented in a direction toward the bonding pad corresponding to the bonding region of the conductive lead.

In another embodiment, the package further comprises a die pad supporting the die in the die region. The die pad is one of square, rectangular, circular, oval, elliptical, and polygonal, in shape.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, a change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. The bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

The semiconductor device package can comprise, for example, a number of different package types, including a ball grid array (BGA), a quad flat package (QFP) and a quad flat non-lead package (QFN).

In another embodiment, the bonding wires comprise: a first set of bonding wires coupling the corresponding first set of bonding regions and the plurality of adjacent bonding pads at the central region of the die, and a second set of bonding wires coupling the corresponding second set of bonding regions and the plurality of adjacent bonding pads at the corner region of the die, wherein at least one of the bonding wires of the first set and at least one of the bonding wires of the second set overlap.

In another embodiment, at least one of the bonding wires of the first set has a higher loop height than the at least one of the bonding wires of the second set.

In another aspect, the present invention is directed to a semiconductor device package. A semiconductor device die is provided in a central die region of the package, the die including a first plurality of bonding pads at a central region of an edge of the die and a second plurality of bonding pads at a corner region of the die. A connecting system includes a plurality of bonding regions about the die region, the bonding regions each corresponding to a designated one of a plurality of the bonding pads of the die, a first set of the bonding regions being positioned along a first guide line and corresponding to the first plurality of adjacent bonding pads at the central region of the die, a second set of the bonding regions being positioned along a second guide line and corresponding to the second plurality of adjacent bonding pads at the corner region of the die. A change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. A plurality of bonding wires are provided, each bonding wire connecting corresponding bonding regions of the connecting system and bonding pads of the die. A plurality of external terminals are provided, each connected to a corresponding one of the plurality of bonding regions.

In one embodiment, the first and second guide lines are discontinuous.

In another embodiment, the connecting system comprises a multiple-layered substrate or multiple layered circuit board having an outer surface, and wherein the bonding regions comprise bonding fingers formed on the outer surface, and further comprises a plurality of conductive vias that connect each of the plurality of bonding fingers to each corresponding one of the plurality of external terminals.

In another embodiment, the connecting system comprises a lead frame wherein the bonding regions comprise bonding tips of the lead frame and wherein the lead frame further comprises conductive leads coupled between each bonding region and a corresponding one of the plurality of external terminals.

In another embodiment, the conductive leads extend in an inward direction past the bonding tips into the die region to serve as a support for a die mounted in the die region. At least one of the conductive leads coupled to the second set of bonding regions includes a first inflection point that redirects the lead toward the central region of the edge of a die mounted in the die region and away from the corner region of the die. At least one of the conductive leads coupled to the second set of bonding regions can further include a second inflection point closer to the die region than the first inflection point that redirects the lead to be oriented in a direction toward the bonding pad corresponding to the bonding region of the conductive lead.

In another embodiment, the package further comprises a die pad supporting the die in the die region. The die pad is one of square, rectangular, circular, oval, elliptical, and polygonal, in shape.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, the bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

The semiconductor device package can comprise, for example, a number of different package types, including a ball grid array (BGA), a quad flat package (QFP) and a quad flat non-lead package (QFN).

In another embodiment, the bonding wires comprise: a first set of bonding wires coupling the corresponding first set of bonding regions and the plurality of adjacent bonding pads at the central region of the die, and a second set of bonding wires coupling the corresponding second set of bonding regions and the plurality of adjacent bonding pads at the corner region of the die, wherein at least one of the bonding wires of the first set and at least one of the bonding wires of the second set overlap.

In another embodiment, at least one of the bonding wires of the first set has a higher loop height than the at least one of the bonding wires of the second set.

In another aspect, the present invention is directed to a semiconductor device package. A semiconductor device die is provided in a central die region of the package, the die including a first plurality of bonding pads at a central region of an edge of the die and a second plurality of bonding pads at a corner region of the die. A connecting system includes: a plurality of bonding regions about the die region; a plurality of external terminals, each connected to a corresponding one of the plurality of bonding regions; and a plurality of conductive leads that couple corresponding bonding regions and external terminals, the bonding regions each comprising bonding tips of the conductive leads, each corresponding to a designated bonding pad of the die, a first set of the bonding regions positioned along a first guide line and corresponding to the first plurality of adjacent bonding pads at the central region of the die, a second set of the bonding regions positioned along a second guide line and corresponding to the second plurality of adjacent bonding pads at the corner region of the die, and wherein at least one of the conductive leads coupled to the second set of bonding regions includes a first inflection point that redirects the lead toward the central region of the edge of the die and away from the corner region of the die. A plurality of bonding wires are provided, each bonding wire connecting corresponding bonding regions of the connecting system and bonding pads of the die.

In one embodiment, the connecting system comprises a lead frame and the bonding regions comprise bonding tips of the lead frame and wherein the lead frame further comprises the conductive leads coupled between each bonding region and a corresponding one of the plurality of external terminals.

In another embodiment, the conductive leads lie on a plane. In another embodiment, the first and second guide lines are discontinuous. In another embodiment, the conductive leads extend in an inward direction past the bonding tips into the die region to support the die.

In another embodiment, at least one of the conductive leads coupled to the second set of bonding regions further includes a second inflection point closer to the die region than the first inflection point that redirects the lead to be oriented in a direction toward the bonding pad corresponding to the bonding region of the conductive lead.

In another embodiment, the package further comprises a die pad supporting the die in the die region. The die pad is one of square, rectangular, circular, oval, elliptical, and polygonal, in shape.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, a change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. The bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

The semiconductor device package can comprise, for example, a number of different package types, including a ball grid array (BGA), a quad flat package (QFP) and a quad flat non-lead package (QFN).

In another embodiment, the bonding wires comprise: a first set of bonding wires coupling the corresponding first set of bonding regions and the plurality of adjacent bonding pads at the central region of the die, and a second set of bonding wires coupling the corresponding second set of bonding regions and the plurality of adjacent bonding pads at the corner region of the die, wherein at least one of the bonding wires of the first set and at least one of the bonding wires of the second set overlap.

In another embodiment, at least one of the bonding wires of the first set has a higher loop height than the at least one of the bonding wires of the second set.

In another aspect, the present invention is directed to a method for wire bonding a semiconductor device package. A semiconductor device die is mounted in a central die region of the package, the die including a first plurality of bonding pads at a central region of an edge of the die and a second plurality of bonding pads at a corner region of the die. A connecting system is provided including: a plurality of bonding regions about the die region, the bonding regions each corresponding to a designated one of a plurality of the bonding pads of the die, a first set of the bonding regions positioned along a first guide line and corresponding to the first plurality of adjacent bonding pads at the central region of the die, a second set of the bonding regions positioned along a second guide line and corresponding to the second plurality of adjacent bonding pads at the corner region of the die, the first and second guide lines being discontinuous; and a plurality of external terminals, each connected to a corresponding one of the plurality of bonding regions. A plurality of bonding wires are bonded to connect corresponding bonding regions of the connecting system and bonding pads of the die.

In one embodiment, the connecting system comprises a multiple-layered substrate or multiple layered circuit board having an outer surface, and wherein the bonding regions comprise bonding fingers formed on the outer surface, and further comprises a plurality of conductive vias that connect each of the plurality of bonding fingers to each corresponding one of the plurality of external terminals.

In another embodiment, the connecting system comprises a lead frame wherein the bonding regions comprise bonding tips of the lead frame and wherein the lead frame further comprises conductive leads coupled between each bonding region and a corresponding one of the plurality of external terminals.

In another embodiment, the conductive leads extend in an inward direction past the bonding tips into the die region to serve as a support for a die mounted in the die region. At least one of the conductive leads coupled to the second set of bonding regions includes a first inflection point that redirects the lead toward the central region of the edge of a die mounted in the die region and away from the corner region of the die. At least one of the conductive leads coupled to the second set of bonding regions can further include a second inflection point closer to the die region than the first inflection point that redirects the lead to be oriented in a direction toward the bonding pad corresponding to the bonding region of the conductive lead.

In another embodiment, the package further comprises a die pad supporting the die in the die region. The die pad is one of square, rectangular, circular, oval, elliptical, and polygonal, in shape.

In another embodiment, the first and second guide lines comprise at least one of a line segment, a curve segment, a sinuous curve segment, a spline curve, an arc segment, a parabolic arc segment, an elliptic arc segment, and a circular arc segment.

In another embodiment, a change in bonding angle between each one of the corresponding first plurality of adjacent bonding pads and first set of bonding regions is incremental, a change in bonding angle between each one of the corresponding second plurality of adjacent bonding pads and second set of bonding regions is incremental, and a change in bonding angle between a last one of the corresponding first plurality of adjacent bonding pads and first set of bonding regions and a first one of the corresponding second plurality of adjacent bonding pads and second set of bonding regions is discontinuous relative to the incremental change. The bonding angles of each corresponding first plurality of adjacent bonding pads and first set of bonding regions and the bonding angles of each corresponding second plurality of adjacent bonding pads and second set of bonding regions are not greater than a maximum acceptable bonding angle.

In another embodiment, the first and second guide lines are positioned at different distances from the die region, and the second guide line is closer to the die region than the first guide line.

The semiconductor device package can comprise, for example, a number of different package types, including a ball grid array (BGA), a quad flat package (QFP) and a quad flat non-lead package (QFN).

In another embodiment, the bonding wires comprise: a first set of bonding wires coupling the corresponding first set of bonding regions and the plurality of adjacent bonding pads at the central region of the die, and a second set of bonding wires coupling the corresponding second set of bonding regions and the plurality of adjacent bonding pads at the corner region of the die, wherein at least one of the bonding wires of the first set and at least one of the bonding wires of the second set overlap.

In another embodiment, at least one of the bonding wires of the first set has a higher loop height than the at least one of the bonding wires of the second set.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
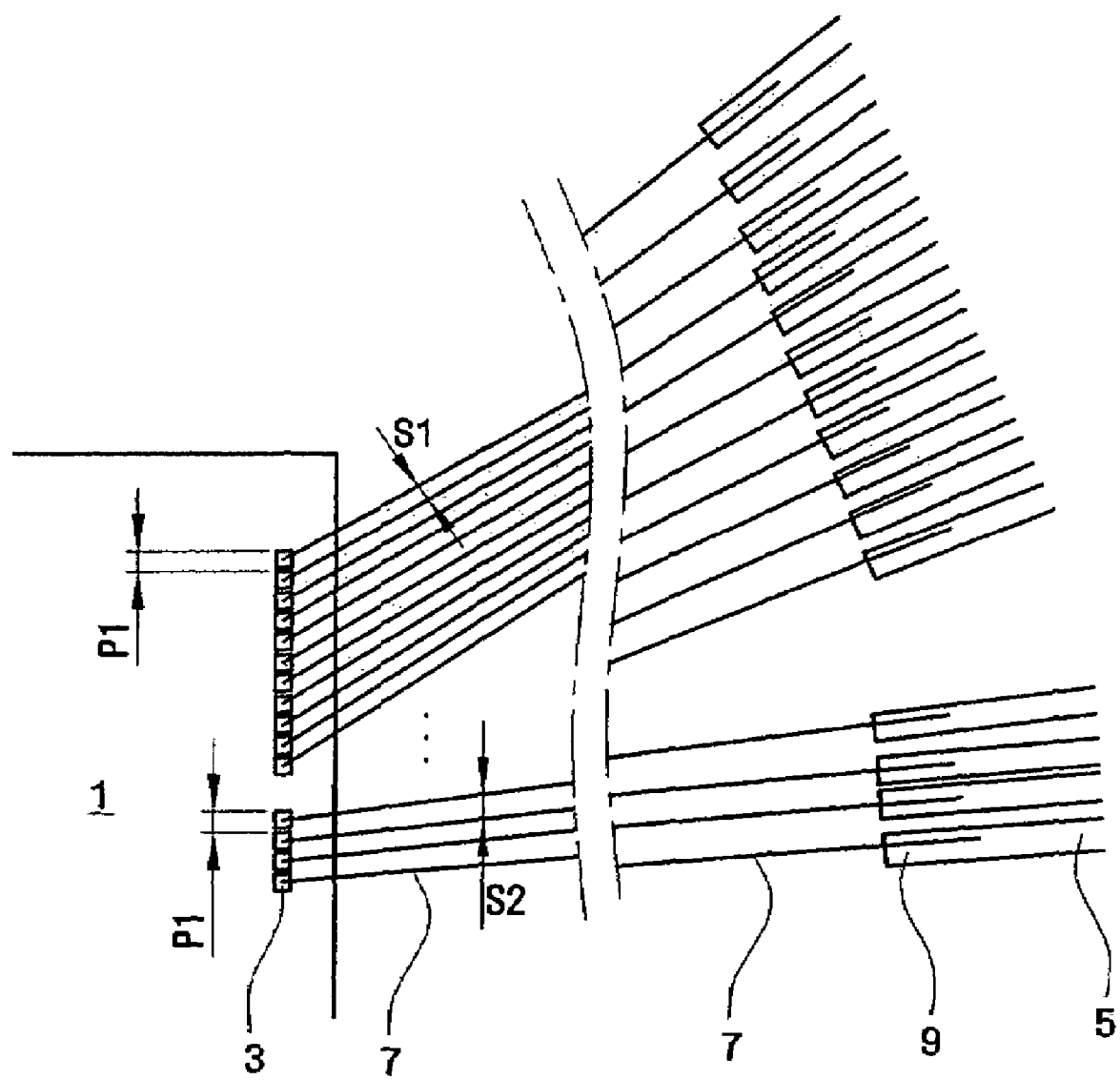
FIG. 1 is a plan view of a conventional bonding configuration between a die and a lead frame.
Figure 2:
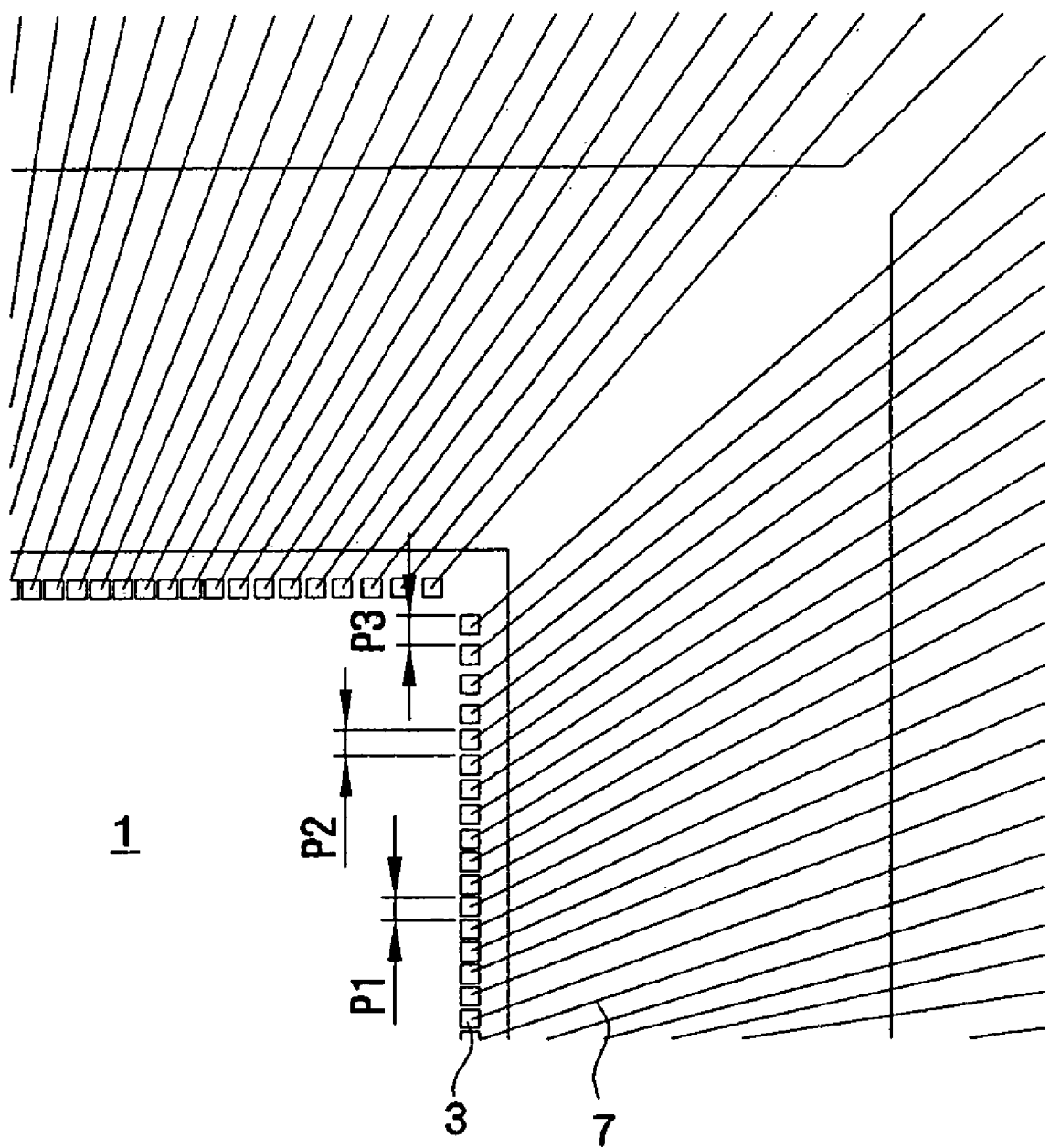
FIG. 2 is a plan view of a conventional bonding configuration in which the spacing, or "pitch", between bonding pads is increased according to the corner rule.
Figure 3:
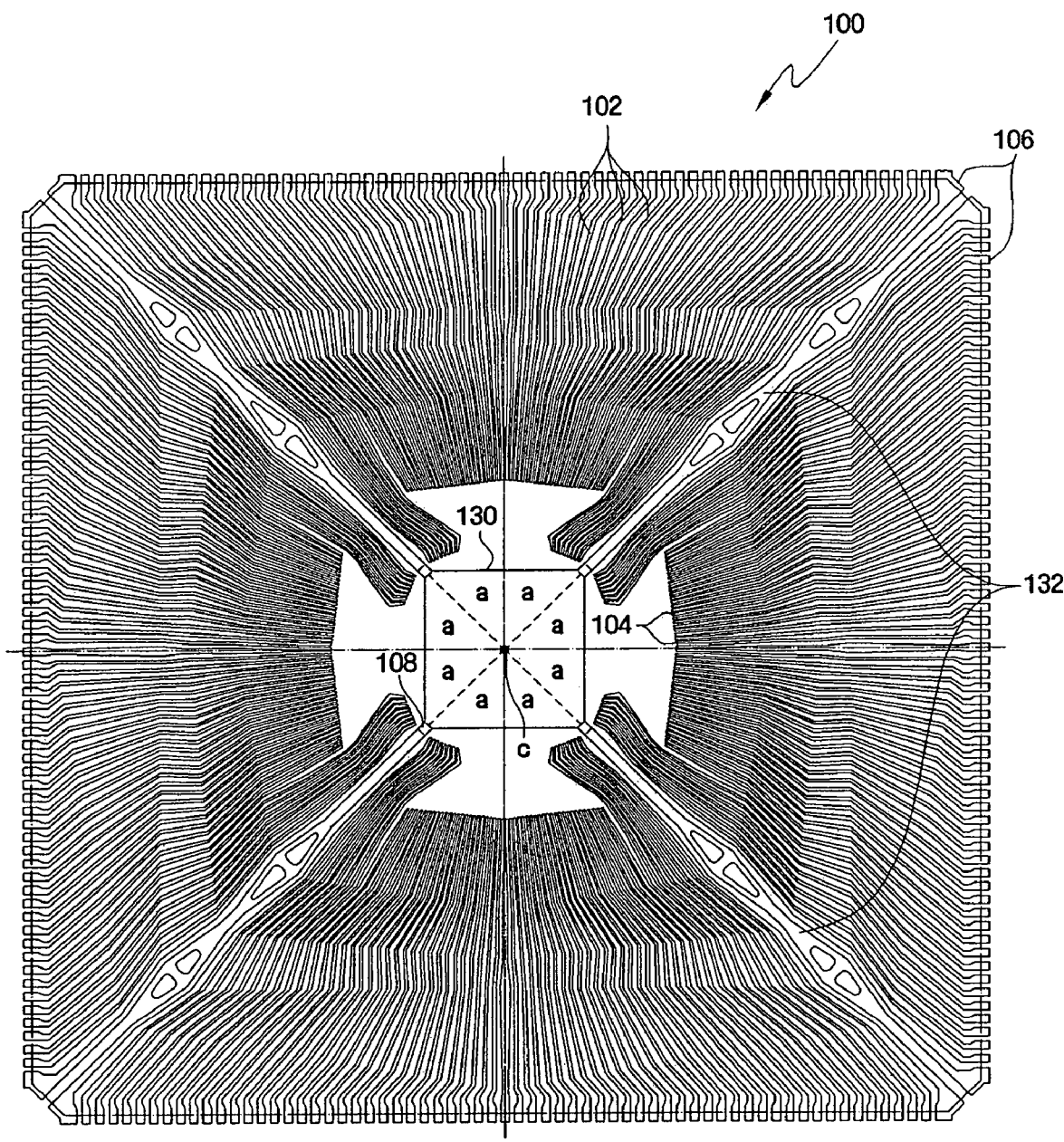
FIG. 3 is a plan view of a connecting board, or "lead frame", that is configured in accordance with the present invention.

FIG. 3 is a plan view of a connecting board, or "lead frame" 100, that is configured in accordance with the present invention. The lead frame 100 of the present invention includes a plurality of leads 102, each extending from a inner end 104 at an inner region of the lead frame to an outer end 106 at an outer region of the lead frame. The leads 102 of the lead frame 100 comprise a conductive metal or alloy, such as copper, aluminum, or gold, or other conductive materials or alloys. Inner ends 104 of the leads of the lead frame 100 surround a region 130 where a die pad or chip pad is to be mounted on the lead frame 100.

A plurality of tie bars 132 extend from four corners of the lead frame. Inner ends 108 of the tie bars 132 extend into the die pad region 130, for supporting a die pad or plate on which the die is mounted. The die pad region 130 has a center point c. Four quadrants surround the center point c, each quadrant comprising two octants a.

The example shown includes 256 leads 102 which form a 256 low profile flat package (LPFP). Other types of lead frames having other lead counts and configurations are equally applicable to the principles of the present invention.

Figure 4:
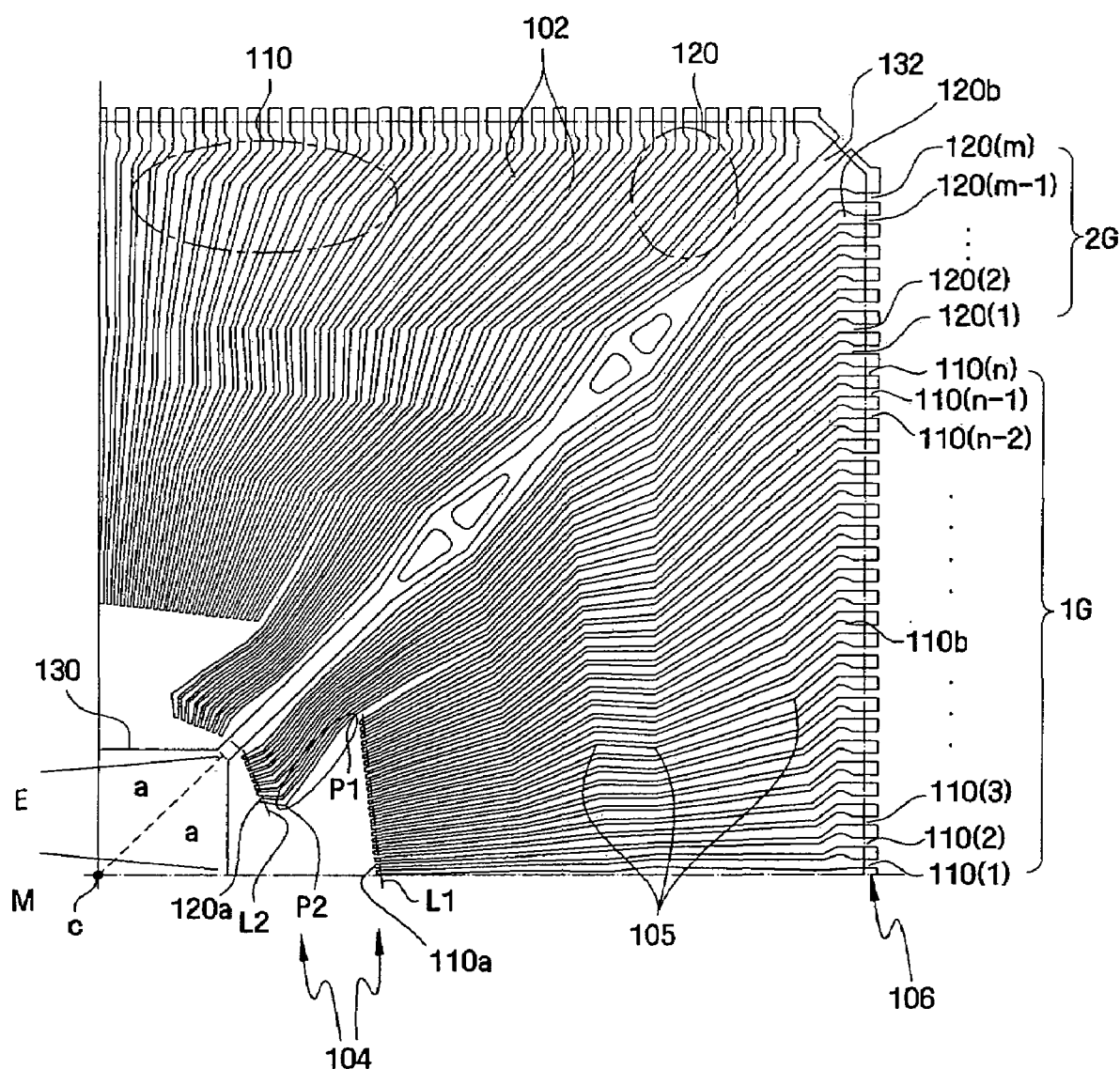
FIG. 4 is a close-up view of the first quadrant of the lead frame of FIG. 3, in accordance with the present invention.

FIG. 4 is a close-up view of the first quadrant of the lead frame 100 of FIG. 3. In this view, it can be seen that each octant a of leads 102 is partitioned into a first group 110 and a second group 120. The first group 110 of leads 102 services bonding pads of the die pad in the die pad region 130 that lie in a central region of the edge of the die. The second group 120 of leads 102 services bonding pads of the die pad in the die pad region 130 that lie in a corner region of the edge of the die. The term "servicing", as used herein refers to leads 102 (or bonding fingers 310 of the substrate-based embodiment discussed below with reference to FIGS. 17-23) that are configured to be bonded by bonding wires to corresponding bonding pads of a die that is mounted in the die pad region 130.

In FIG. 4, the first group 110 of leads 102 includes leads 110(1) . . . 110(n) that include outer ends 106 that terminate along the outer perimeter of the lead frame. Inner ends 104 of the first group of leads terminate at an inner region of the lead frame along a first line segment L1. The second group 120 of leads 102 includes leads 120(1) . . . 120(m) that include outer ends 106 that terminate along the outer perimeter of the lead frame. Inner ends 104 of the second group of leads terminate at an inner region of the lead frame. The inner ends 104 of the second group of leads terminate along a second line segment, L2. The second line segment L2 is spaced apart from the first line segment L1, for example at a position that is closer to the die pad region 130 than the first line segment L1.

The line segments L1 and L2 are referred to in the art as "guide lines", and may comprise line segments that lie along straight lines, or optionally may comprise a series of line segments that lie at different angles. Alternatively, the guide lines may lie along a segment of a curve, a sinuous or "spline" curve, or an arc, such as a parabolic, elliptic or circular arc. The term "guide line", as used herein, encompasses these, and other, various types of curves and line segments.

According to the present invention, the first line segment, or first guide line L1, of bonding regions of the lead 102 is independent of the second line segment, or second guide line L2. For example, the second guide line L2 associated with the second group of leads 120 (or bonding fingers 320 of FIG. 17 below) that services bonding pads in a corner region of the die may lie at a position that is closer than the first guide line L1 associated with a first group of leads 110 (or bonding fingers 310 of FIG. 17) that services bonding pads in a central portion of the edge of the die, as shown in FIG. 4.

The first and second guide lines are also discontinuous in the sense that they do not intersect at their end points. For example, the outermost lead 110(n) of the first group 110 of leads terminates at an inner region of the lead frame at the inner end 104 along the line segment of guide line L1. Also, the innermost lead 120(1) of the second group 120 of leads terminates at an inner region of the lead frame at the inner end 104 along the line segment of guide line L2. The outermost lead 110(1) of the first group of leads 110 and the innermost lead 120(1) of the second group of leads 120 service adjacent bonding pads of a die mounted in the die region 130 (for example, bonding pads of the central region and the corner region respectively), yet the positions of the guide lines L1, L2 do not intersect at the bonding regions at the tips of these adjacent leads. Thus, the first and second guide lines L1, L2 are discontinuous.

The leads 102 undergo a number of lateral redirections, or bends 105, between the inner ends 104 and outer ends 106. The bends 105, or inflection points, serve to increase contact area between the conductive lead frame 100 and the molding compound that eventually will be molded about the leads for forming the body of the package, after the die pad in the die pad region 130 is bonded to the lead frame 100 by the bonding wires. The bends 105 also serve to position the bonding regions at the inner ends 104 of the leads 102 at a suitable orientation such that a longitudinal axis of the bonding region is generally directed toward a corresponding bonding pad on the die, for increasing the region of contact of the bonding wire between the corresponding bonding pad of the die and bonding region of the lead.

Leads of the second group 120 terminate along a guide line segment L2 that is closer in position to the edge of the die than the first group of leads 110, which terminate along line L1. Also, at least a portion of the second guide line segment L2 is positioned between the first guide line segment L1 and the bonding pads of the die. In this manner, the bonding regions of the second group of leads are positioned closer to the bonding pads in the corner regions of the die, and the bonding angle in the corner regions of the die is reduced to an acceptable amount. Therefore, by effectively resetting the bonding angle for the second group of leads 120, the bonding angle for each and every lead is maintained at an amount that is less than a maximum acceptable bonding angle. In one example, a bonding angle of less than about 30 to 35 degrees is considered to be an acceptable maximum bonding angle. This allows the chip to be bonded with high reliability without the need for applying the corner rule, and therefore without the need for increasing the chip size to accommodate a gradual increase in pitch between adjacent bonding pads. This leads to reduced manufacturing costs, an increase in the number of chips fabricated per wafer, or "net die", and increased fabrication throughput.

Orienting the bonding region of the lead 102 in the direction of the corresponding bonding pad provides for more efficient bonding. The bonding region, or bonding area, of a lead is commonly referred to as a "bonding tip" in the case of a lead frame, and as a "bonding finger" in the case of a package substrate-based technology, such as that used in a Ball Grid Array (BGA) package. Increase in efficiency is especially realized in the case where ultrasonic bonding is used. In this case, orienting the long axis of the wire bonding tip substantially in-line with the bonding pad, allows for optimal use of the ultrasonic energy for bonding, leading to faster and more reliable bonding. In addition, in the case of a lead frame, the lead is more robust in the longitudinal direction, as opposed to the transverse direction, and therefore, orientation of the long axis of the bonding tip of the lead in this manner renders the lead a stronger base structure for the bonding procedure.

Figure 5:
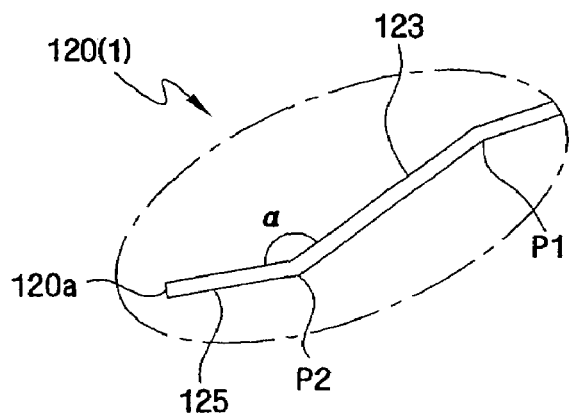
FIG. 5 is a close-up view of a bonding tip of a first lead of the second group of leads of the lead frame of FIG. 4, in accordance with the present invention.

FIG. 5 is a close-up view of a bonding tip 120a of lead 120(1) of the lead frame 100 of FIG. 4. In this view it can be seen that the lead 120(1) includes a bend at point P1, at which point the lead makes a bend such that a first segment 123 extends the lead 120(1) away from the corner region of the die and toward the center region of the die. The bend at point P1 is necessary to laterally redirect the first lead 120(1) of the second group 120 of leads about the bonding tip 110a of the last lead 110(n) of the first group 110 of leads that lies along line segment L1 in order to position the bonding tip 120a of the lead 120(1) between the die region and the bonding tips 110a of the first group 110 of leads. Another bend in the lead 120(1) is present at point P2 where an additional second segment 125 of the lead 120(1) re-orients the lead 120(1) in a direction toward the corresponding bonding pad of the die in the die region 130. Thus, the second segment 125, and the bonding region of the lead located on the segment, each has a longitudinal axis that is substantially oriented toward a corresponding bonding pad on the die, referred to as a "face-to-face" configuration, resulting in the advantages outlined above.

The remaining bonding tips 120a of the second group 120 of leads 120(1) . . . 120(m) include similar first and second bending points P1, P2, resulting in bonding tips that are oriented in a "face-to-face" configuration with corresponding bonding pads on the die. In the example of FIG. 4, the angles α of the bending points P1, P2 are more pronounced in the leads servicing the central region of the die than leads servicing the corner region of the die. In this manner, when bonding tips 10a of the outermost leads, for example leads 110(n-2), 110(n-1), 110(n) of the first group 110 begin to result in a bonding angle that approaches the critical bonding angle, the next adjacent lead, being the first lead 120(1) of the second group 120 of leads, extends toward the center region of the die, in order to reposition the next set of leads and corresponding bonding tips 120a that lie along line segment L2, such that the bonding angle for those leads 120 is adjusted and effectively reset to an appropriate bonding angle for the set of second group or leads 120. This results in a discontinuity between the bonding angle of the last lead 110(n) of the first group of leads 110 (which may be at or near the maximum allowable bonding angle) and the bonding angle of the first lead 120(1) of the second group of leads 120 (which may be at or near a bonding angle of zero or may actually lie at an angle that is of opposite sign to that of the last lead 110(n) of the first group 110). Thus, a discontinuity exists between the bonding angles of adjacent leads 110(n) and 120(1) on the same side of the lead frame, and their corresponding adjacent bonding pads of the same of the die mounted in die region 130.

Figure 6:
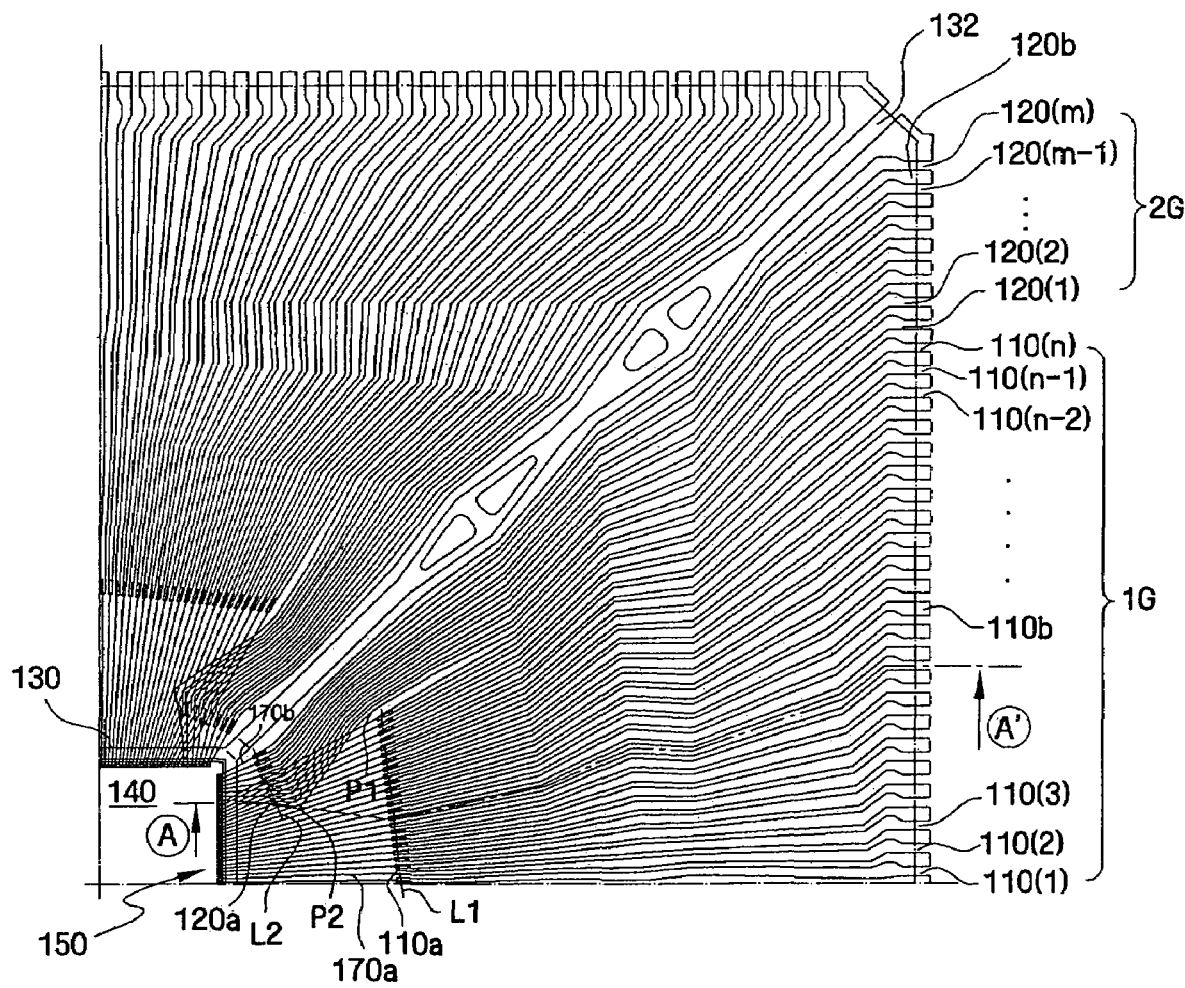
FIG. 6 is a top view of the lead frame of FIG. 4 bonded to a die, in accordance with the present invention.

FIG. 6 is a top view of the lead frame 100 of FIG. 4 bonded to bonding pads of a die 140. The die 140 and leads 110, 120 are bonded using conductive bonding wires 170a, 170b, such as gold or copper wire. It can be seen that the bonding tips 110a of the first group 110 of leads lie along line segment L1, and that the bonding wire 170a of the first lead 110(1) of the first group has a bonding angle of about 0 degrees, while the wire 170a of the outermost lead 10(n) of the first group has a bonding angle that is approaching the maximum acceptable bonding angle, for example about 30 degrees. It can also be seen that the bonding tips 110b of the second group 120 of leads lie along line L2, and that the wire 170b of the first lead 120(1) of the second group has a bonding angle of about 0 degrees, and in this example, actually has a negative bonding angle of about −10 degrees, while the wire 170b of the outermost lead 120(m) of the second group has a bonding angle that is below the maximum acceptable bonding angle of 30 degrees. Thus, a discontinuity exists between the bonding angles of adjacent leads 110(n) of the first group, which has a bonding angle of about 30 degrees, and lead 120(1) of the second group, which has a bonding angle of about −10 degrees.

To accomplish wire bonding in this configuration, the wires 170a used to bond the first lead group 110 are made to have a higher loop height than the wires 170b used to bond the second lead group 120. This prevents shorting of the wires 170a, 170b for those leads of the first and second groups 110, 120 that overlap.

In this manner, all leads of the first group 110 and the second group 120 have bonding tips that are positioned relative to their corresponding bonding pads to lie within the maximum acceptable bonding angle of the package/die combination. The need for applying the corner rule to the chip die is thus eliminated, and maximum use of bonding pads on the die can be realized, and the die can thus be made to have a smaller area. At the same time, the leads are also oriented such that the longitudinal axis of the segment on which the bonding region is placed on the lead is directed toward the corresponding bonding pad, in a "face-to-face" configuration, which leads to a stronger wire-lead bond, as described above.

Figure 7:
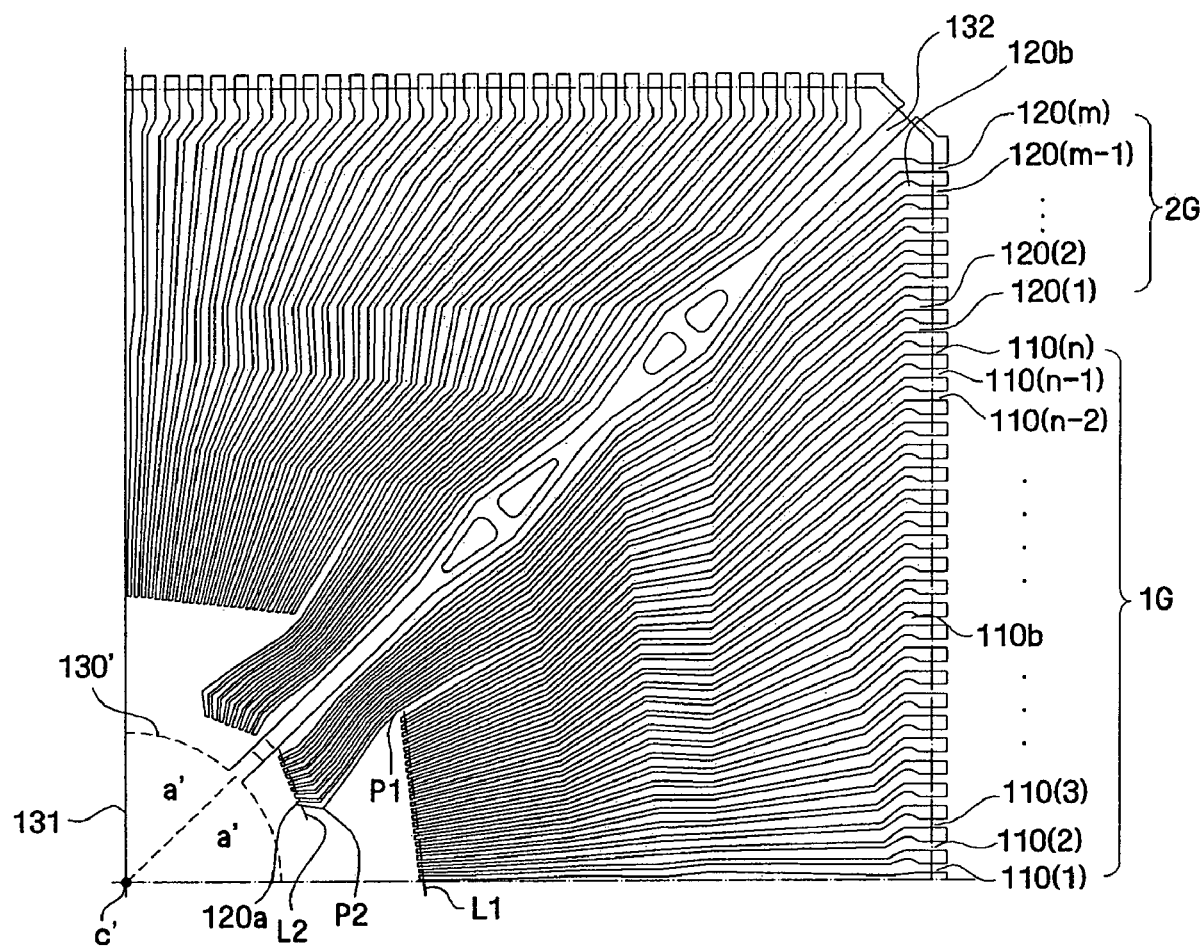
FIG. 7 is a close-up view of the first quadrant of a first alternative embodiment of a lead frame, in accordance with the present invention.

FIG. 7 is a close-up view of the first quadrant of a first alternative embodiment of a lead frame, in accordance with the present invention. In this embodiment, the lead frame is configured in the same manner as that of FIG. 4. However, the die pad 130' in this embodiment is circular, rather than square or rectangular. Such a circular, or elliptical, die pad is advantageous, in certain applications, for efficient heat dissipation of a die mounted thereto. The bonding configurations of the present invention are equally applicable to these, and other, die pad shapes and orientations.

Figure 8:
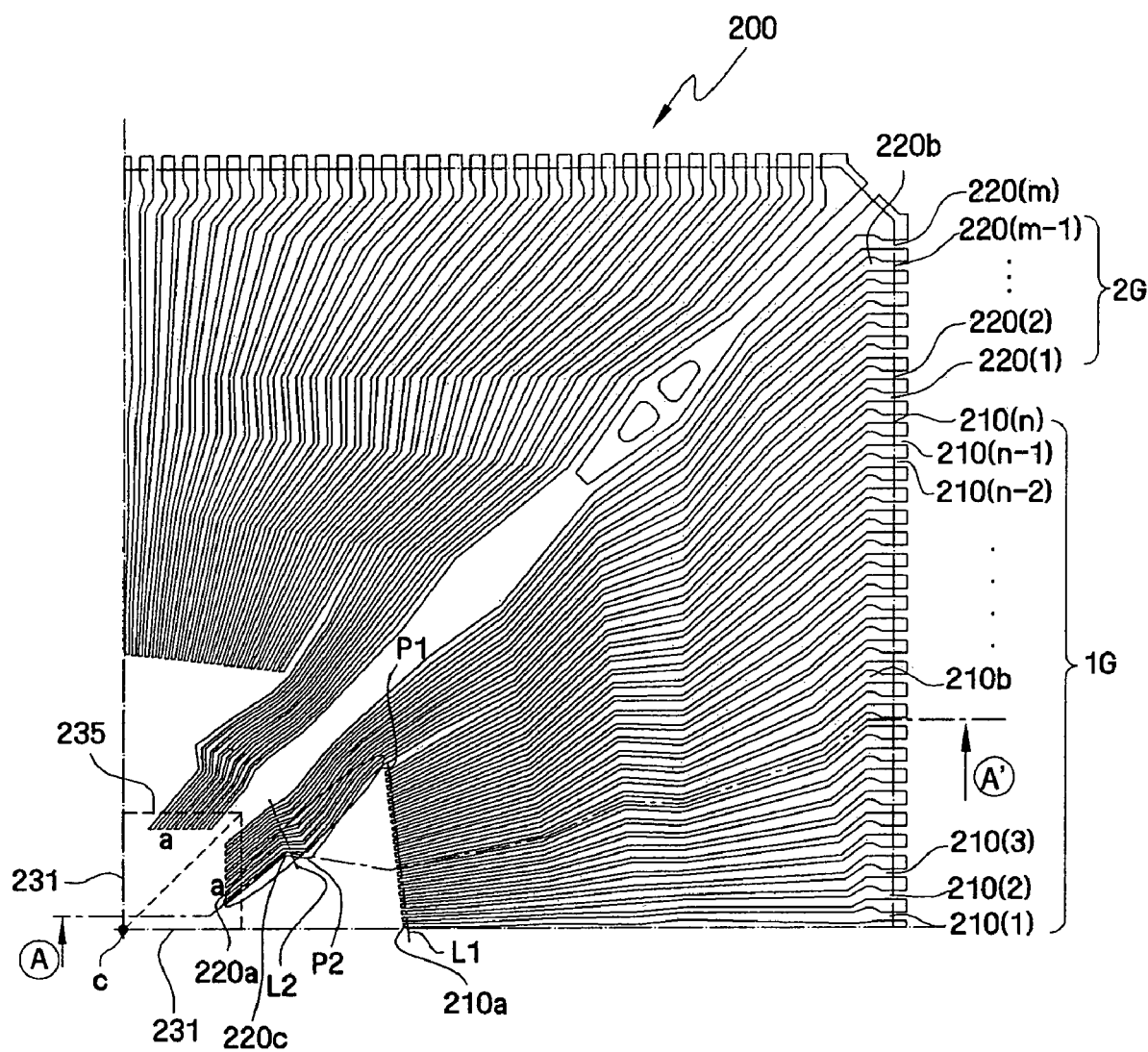
FIG. 8 is a close-up view of the first quadrant of a second alternative embodiment of a lead frame, in accordance with the present invention.

FIG. 8 is a close-up view of the first quadrant of a second alternative embodiment of a lead frame 200, in accordance with the present invention. In this embodiment, no die pad is used, and therefore, no tie bars 132 are necessary. Instead, in this embodiment, the second group of leads 220 are made to extend along elongated segments 220a into the die region 235, beyond their respective bonding regions 220c that lie along line segment L2. The elongated segments 220a extend into the die region 235, and operate as a vertical support for the die 231. The die 231 is thus mounted directly to the tops of the elongated segments 220a, and the bonding pads of the die 231 are wire-bonded to the bonding regions 210a, 220c of the first and second groups of leads 210, 220, in the same manner as that described above with reference to FIG. 6. Once again, in this example, the first guide line L1 and second guide line L2 are discontinuous.

Figure 9:
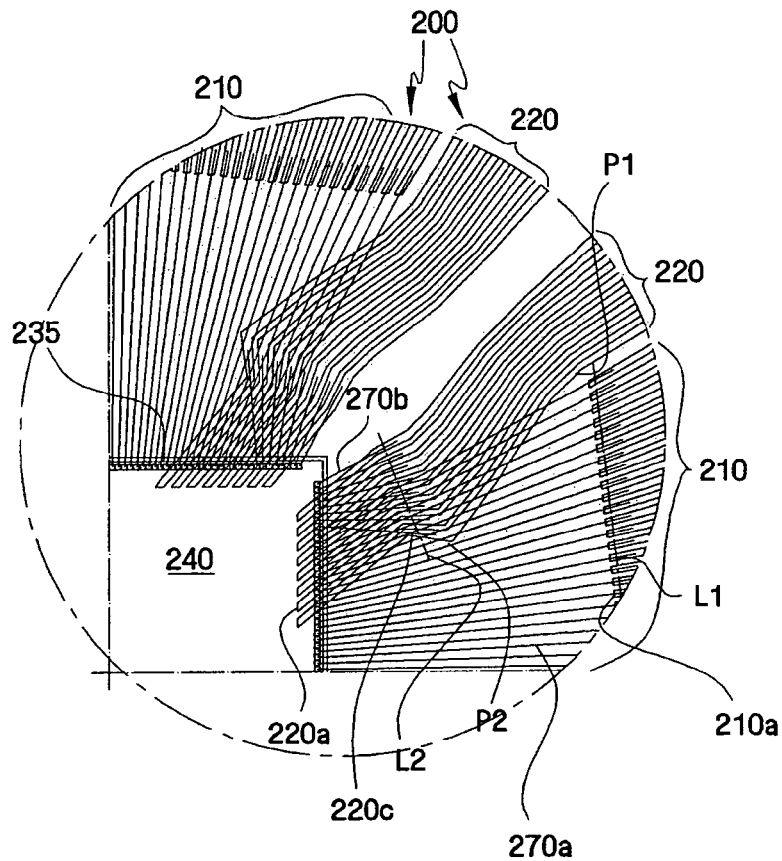
FIG. 9 is a close-up top view of the lead frame of FIG. 8 bonded to a die, in accordance with the present invention.

FIG. 9 is a close-up top view of the lead frame 200 of FIG. 8 bonded to a die 240. The die 240 and leads 210, 220 are bonded using conductive bonding wires 270a, 270b, such as gold or copper wire. It can be seen that this embodiment offers the same advantages with regard to reduced bonding angle and with regard to face-to-face orientation of the bonding tips 210a, 220c as does the embodiment of FIG. 6. A difference lies in that for the second group of leads 220, the bonding tips 220c in the embodiment of FIGS. 8 and 9 are positioned at an intermediate location of the leads 220, as the leads 220 continue to extend further into the die region 235, as opposed to the bonding tips 120a of the embodiment of FIGS. 3-5, in which the tips 120a are positioned at or near an inner end 104 of the leads 120. In addition, in the present embodiment, the die 240 is mounted directly to the second group of leads 220 of the lead frame 200. Thus, when an epoxy or other fluid package material compound is molded about the resulting structure, a stronger bond is provided directly between the die and lead frame. This reduces susceptibility in the package to temperature, stress and moisture that otherwise would result from the added component of the die pad.

Figure 10:
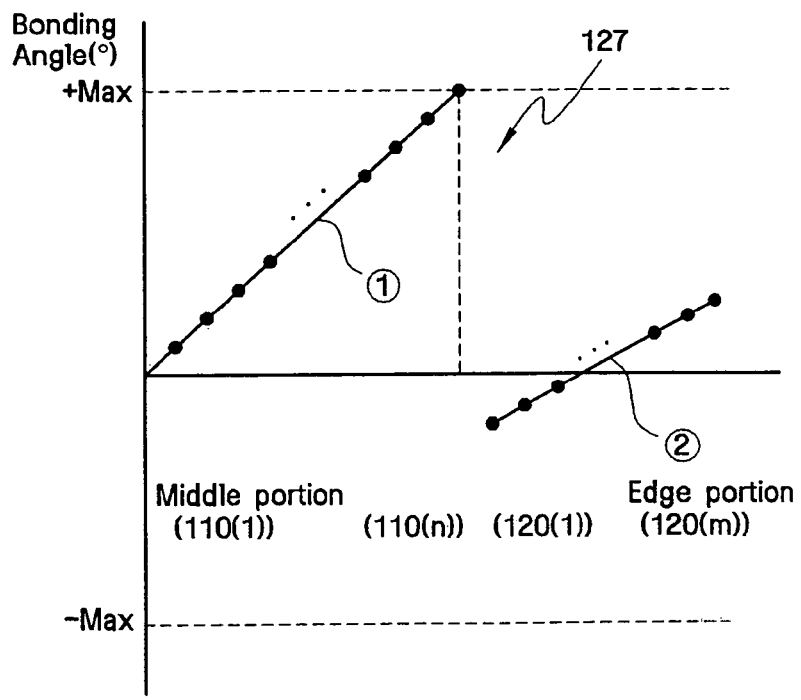
FIG. 10 is a chart of bonding angles for bonding wires of the first group of leads and for bonding wires of the second group of leads for the lead frame of FIG. 6, in accordance with the present invention.

FIG. 10 is a chart of bonding angles for bonding wires 170a of the first group of leads 110 and for bonding wires 170b of the second group of leads 120 for the lead frame of FIG. 6 or FIG. 8, in accordance with the present invention. Chart 1 of FIG. 10 graphically depicts the incremental increase in bonding angle from an angle of near zero degrees for bonding the first lead 110(1) of the first lead group 110, and incrementally progressing to an angle at or below the maximum acceptable bonding angle MAX for the last lead 110(n) of the first lead group 110. The next adjacent lead, namely the first lead 120(1) of the second lead group 120 (see Chart 2) has a bonding angle that is well within the acceptable range, and in fact has a bonding angle that is of a sign that is opposite that of lead 10(n). From there, the bonding angles of the second group of leads 120 incrementally progress back toward a positive value, and the last lead 120(m) of the second group of leads 120 has a bonding angle that is well within the maximum acceptable value MAX. The chart of bonding angles thus demonstrates a discontinuity 127 between the bonding angles of the leads of the first group (see chart 1) and the bonding angles of the adjacent leads of the second group (see chart 2).

Figure 11:
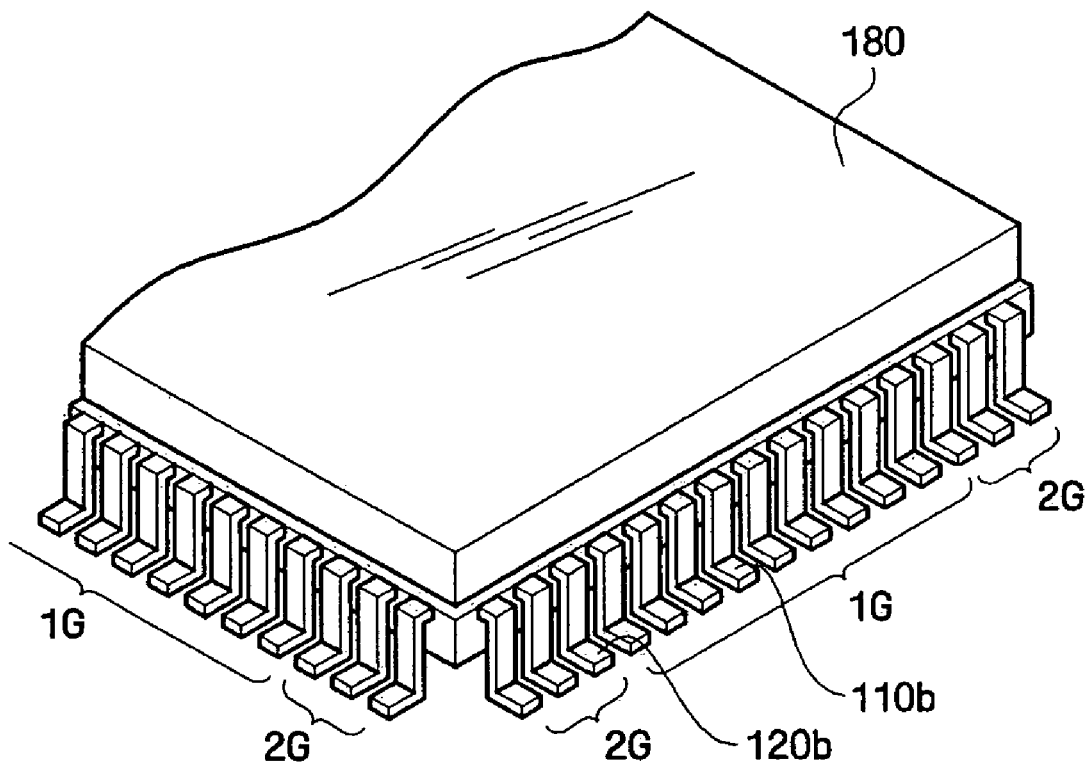
FIG. 11 is a perspective view of a Quad Flat Package (QFP) that has a first group of leads in a central region of the chip edge and a second group of leads in a corner region, in accordance with the present invention.
Figure 12:
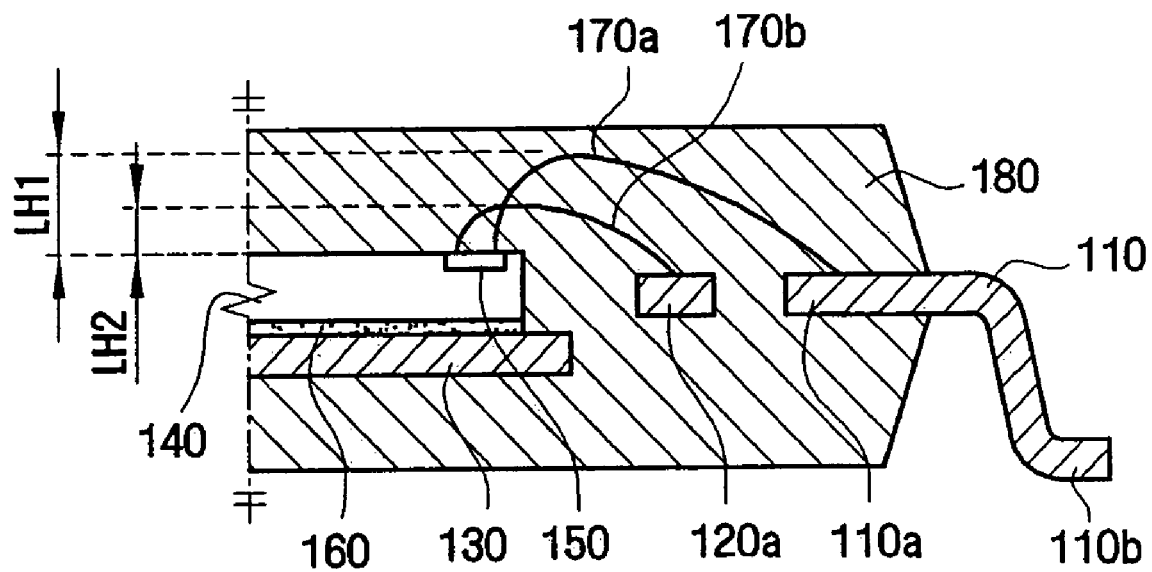
FIG. 12 is a cross-sectional view of the QPF of FIG. 11 taken along section line A-A' of FIG. 6.

FIG. 11 is a perspective view of a Quad Flat Package (QFP) that has a first group 1G of leads 110b and a second group 2G of leads 120b, in accordance with the present invention. This QFP corresponds with the embodiment of the present invention illustrated in FIG. 6. FIG. 12 is a cross-sectional view of the QFP of FIG. 11 taken along section line A-A' of FIG. 6. The QFP includes a mold compound 180 that surrounds and encompasses the die pad 130, chip die 140, first and second groups of leads 110, 120, associated bonding regions or tips 110a, to 120a and bonding wires 170a, 170b. The chip die 140 is coupled to the die pad 130 via adhesive 160. In this view, it can also be seen that the first group 170a of bonding wires has a greater loop height LH1 than the loop height LH2 of the second group of bonding wires 170b, in order to avoid shorting between the wires 170a, 170b.

Figure 13:
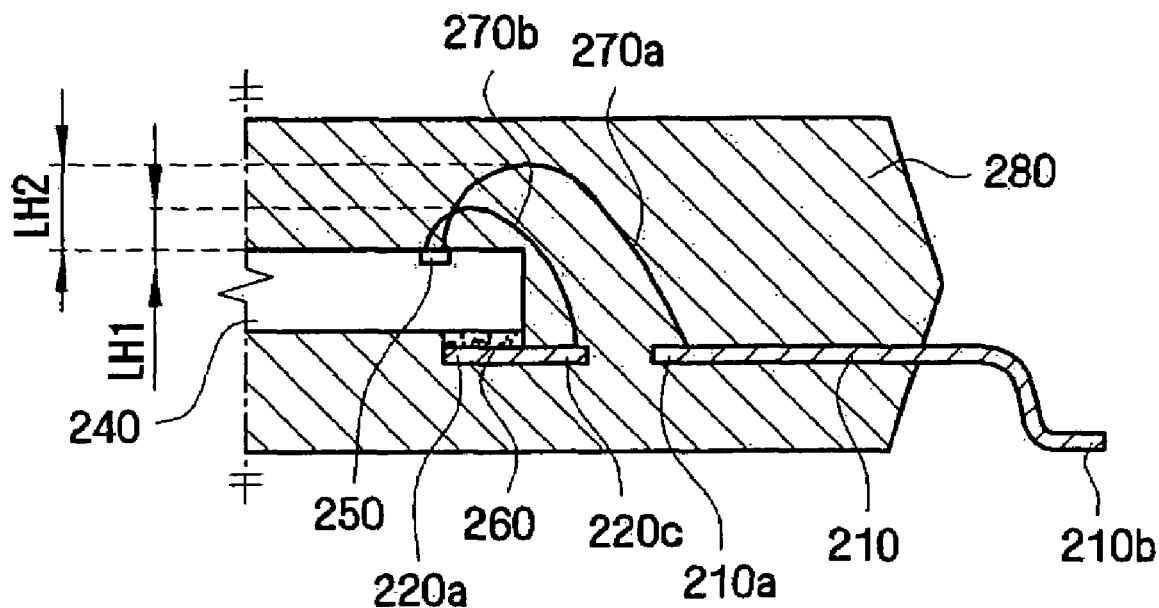
FIG. 13 is a cross-sectional view of a QFP that corresponds with the embodiment of the present invention illustrated in FIG. 8 taken along section line A-A', in accordance with the present invention.

FIG. 13 is a cross-sectional view of a QFP that corresponds with the embodiment of the present invention illustrated in FIG. 8 taken along section line A-A'. The QFP includes a mold compound 280 that surrounds and encompasses the chip die 240, first and second groups of leads 210, 220, associated bonding regions 210a, 220c, and bonding wires 270a, 270b. In this configuration, the leads 220 of the second group include extension segments 220a that extend below the chip die 240 as described above. The chip die 240 is mounted directly to the extension segments 220a of the second group of leads 220 via adhesive 260, and thus, no die pad is needed in this embodiment. Again, in this embodiment, the first group 270a of bonding wires has a greater loop height LH2, than the loop height LH1 of the second group of bonding wires 270b, in order to avoid shorting between the wires 270a, 270b.

Figure 14:
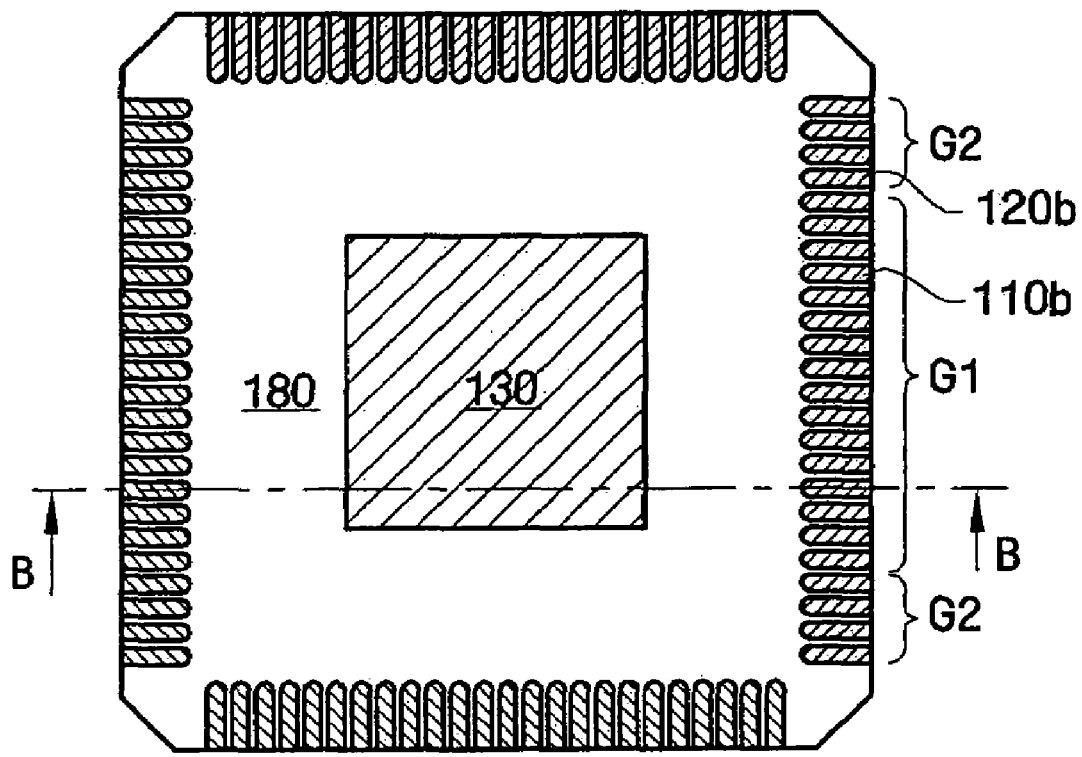
FIG. 14 is a top view of a Quad Flat Non-lead Package (QFN) that has a first group of leads in a central region of the chip edge and a second group of leads in a corner region, in accordance with the present invention.
Figure 15:
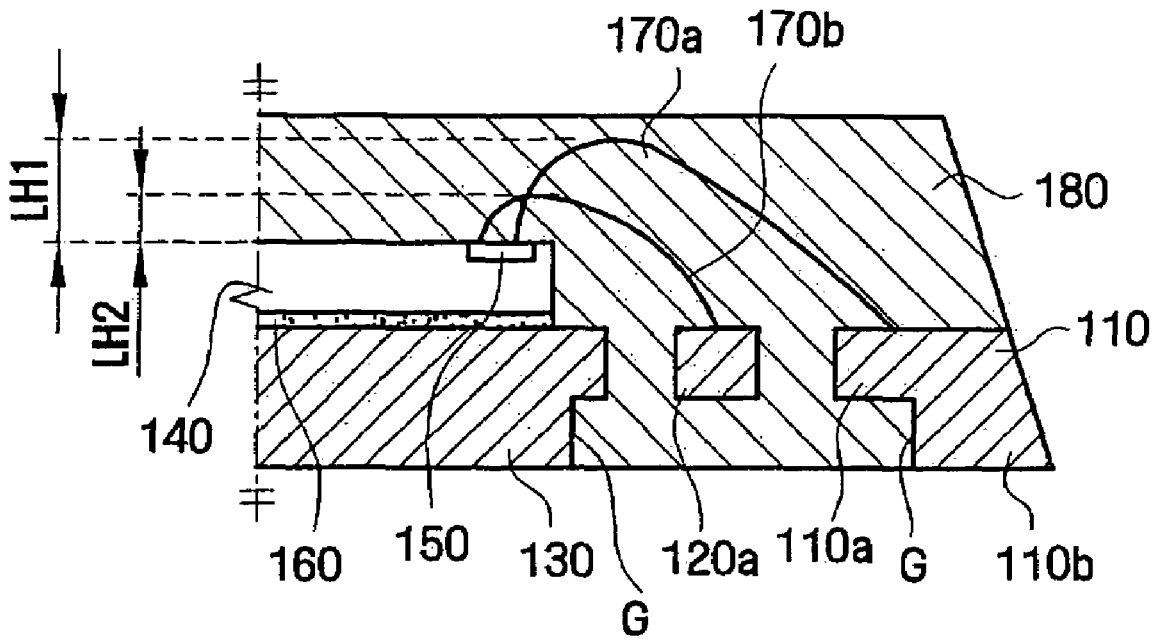
FIG. 15 is a cross-sectional view of the QPF of FIG. 14 taken along section line B-B of FIG. 14.

FIG. 14 is a top view of a Quad Flat Non-lead Package (QFN) that has a first group 1G of leads 110b associated with bonding pads in the central regions of the die and a second group 2G of leads 120b associated with bonding pads in the corner regions of the die, in accordance with the present invention. This QFP corresponds with the embodiment of the present invention illustrated in FIG. 6. FIG. 15 is a cross-sectional view of the QFP of FIG. 14 taken along section line B-B' of FIG. 14. The QFP includes a mold compound 180 that surrounds and encompasses the die pad 130, chip die 140, first and second groups of leads 110, 120, associated bonding regions or tips 111a, 120a, and bonding wires 170a, 170b. The chip die 140 is coupled to the die pad 130 via adhesive 160. The leads 110, 120 of this configuration take the form of metal contacts that terminate at the perimeter of the package. Once again, the first group 170a of bonding wires has a greater loop height LH1 than the loop height LH2 of the second group of bonding wires 170b, in order to avoid shorting between the wires 170a, 170b. In addition, a groove G formed in an underside of the die pad 130 and the lead terminals 110, 120 allows the mold compound 180 to more thoroughly surround the die pad and lead terminals 110, 120, thereby anchoring the components in the package with enhanced stability and reliability.

Figure 16:
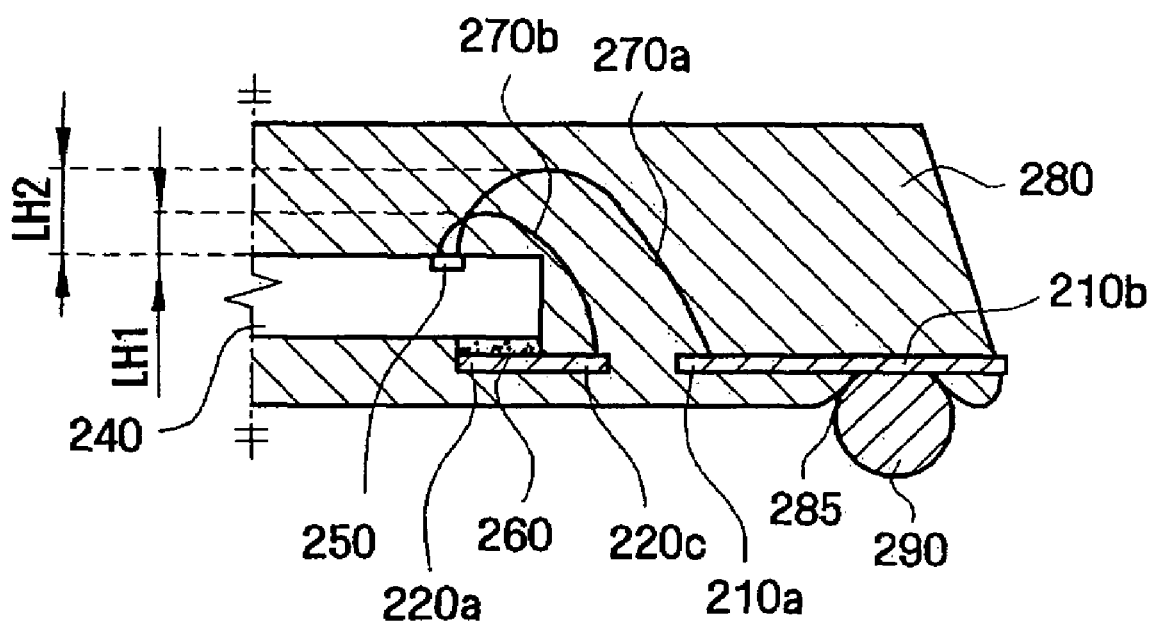
FIG. 16 is a cross-sectional view of a Ball Grid Array (BGA) package that corresponds with the embodiment of the present invention illustrated in FIG. 8 taken along section line A-A'.

FIG. 16 is a cross-sectional view of a Ball Grid Array (BGA) package that corresponds with the lead frame embodiment of the present invention illustrated in FIG. 8 taken along section line A-A'. The BGA includes a mold compound 280 that surrounds and encompasses the chip die 240, first and second groups of leads 210, 220, and bonding wires 270a, 270b. In this configuration, the leads of the second group 220 include extension segments 220a that extend below the chip die 240. The chip die 240 is mounted directly to the extension segments 220a of the second group of leads 220 via adhesive 260, and thus, no die pad is needed. Again, in this embodiment, the first group 270a of bonding wires has a higher loop height LH2, than the loop height LH1 of the second group of bonding wires 270b, in order to avoid shorting between the wires 270a, 270b. Exposed holes 285 at the outer end of leads 210b provide for direct access to the leads 210b. Ball structures 290 are placed in the exposed holes 285 to provide external terminals for the package.

Figure 17:
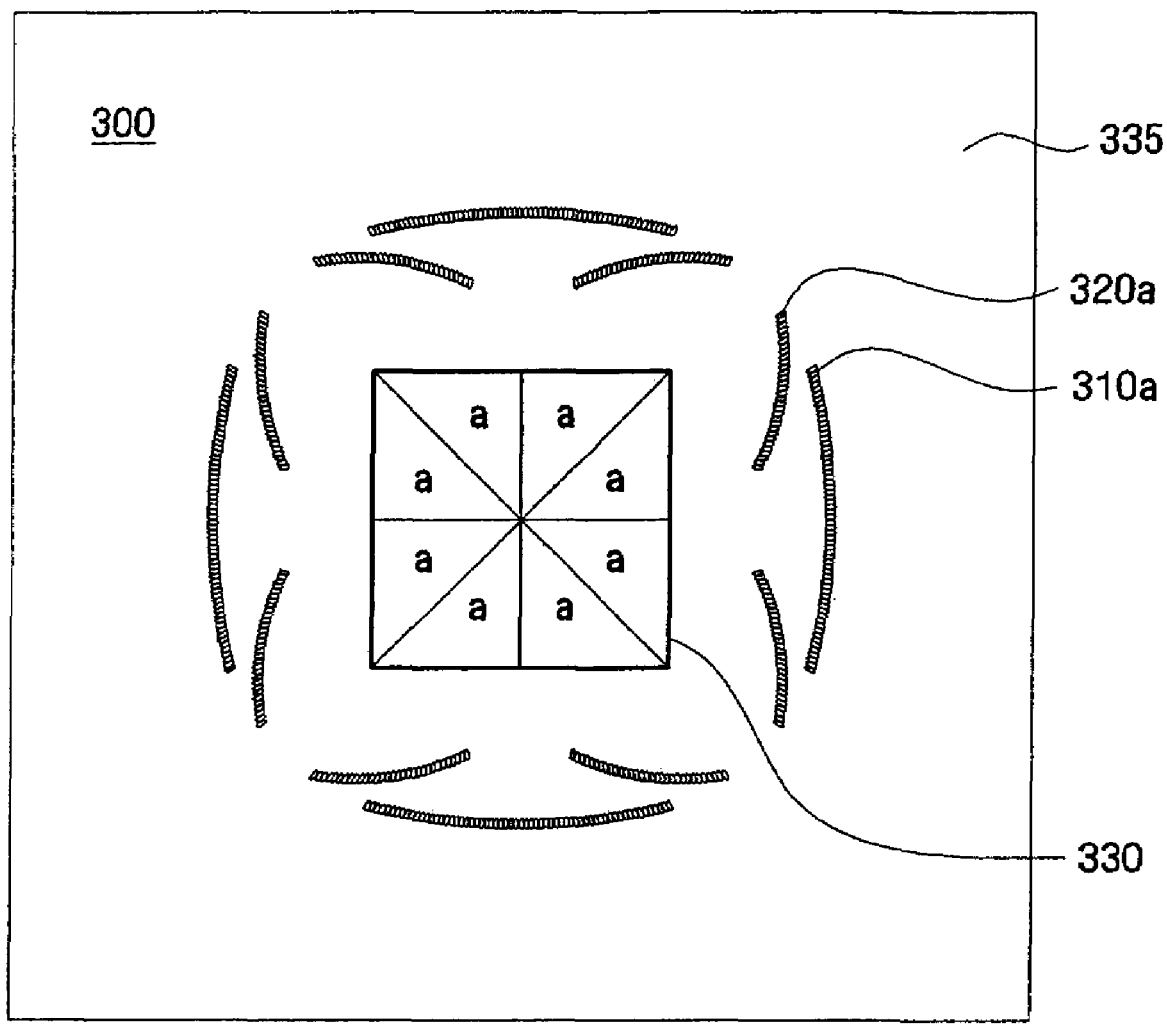
FIG. 17 is a top view of a substrate of a substrate-based Ball Grid Array (BGA) package, in accordance with the present invention.

FIG. 17 is a top view of a substrate of a substrate-based Ball Grid Array (BGA) package, in accordance with the present invention. The substrate 300 includes multiple layers of interconnects, or vias, and comprises one of a printed circuit board, a ceramic substrate, a polymide film, a semiconductor substrate such as a silicon substrate, and the like. The substrate includes a central die pad region 330 and a plurality of bonding features 310a, 320a, referred to in this technology as "bonding fingers". A first group of bonding fingers 310a service bonding pads of a chip mounted in the die pad region 330 that are located in a central region of the edge of the die, in the same manner that the first group of leads 110 accomplish this in the above-described lead frame of FIG. 4. A second group of bonding fingers 320b service bonding pads of a die mounted in the die pad region 330 that are located in corner regions of the edge of the die, in the same manner that the second group of leads 120 accomplish this in the above-described lead frame of FIG. 4. The bonding fingers 310a, 310b are routed to external terminals, or leads, of the package by the multiple-layered interconnects or vias of the substrate 300.

Figure 18:
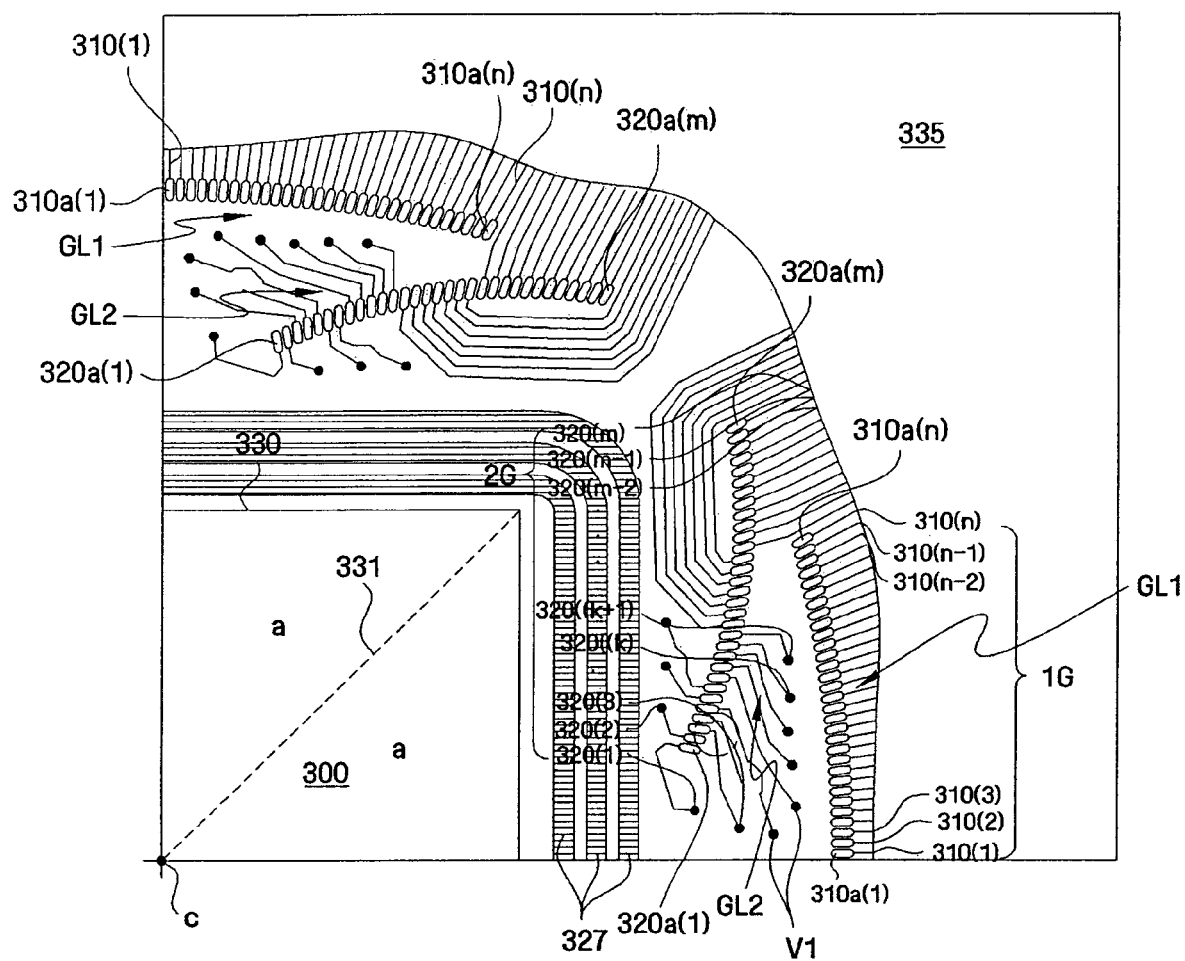
FIG. 18 is a close-up view of the first quadrant of the substrate and bonding fingers of the BGA of FIG. 17, in accordance with the present invention.

FIG. 18 is a close-up view of the first quadrant of the substrate of the BGA of FIG. 17, in accordance with the present invention. In this view, point c is the center point of the die pad 330. The substrate, or connecting board, 300, includes a plurality of first groups of patterned circuits 1G, including vias 310(1) ... 310(n) and corresponding bonding fingers 310a(1) ... 310a(n), and a plurality of second groups of patterned circuits 2G, including vias 320(1) ... 320(m) and corresponding bonding fingers 320a(1) ... 320a(m). In this embodiment, each octant about the center point c includes both first and second groups 1G, 2G of bonding fingers 310a, 320a. In the same manner as the lead frame embodiments described above, the first group 1G of bonding fingers 310 services bonding pads of the die pad in the die pad region 330 that lie in a central region of the edge of the die. The second group 2G of bonding fingers 320a services bonding pads of the die pad in the die pad region 330 that lie in a corner region of the edge of the die. The term "servicing", as used herein refers to bonding fingers 310a that are configured to be bonded by bonding wires to corresponding bonding pads of a die that is mounted in the die pad region 330.

Figure 19:
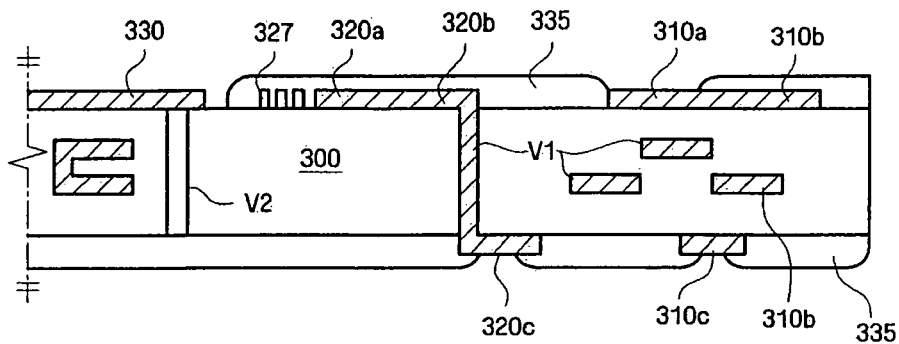
FIG. 19 is a cross-sectional view of the substrate and bonding fingers of the BGA of FIGS. 17 and 18, in accordance with the present invention.

FIG. 19 is a cross-sectional view of the substrate and bonding fingers of the BGA of FIGS. 17 and 18, in accordance with the present invention. As shown in FIG. 19, each of the first group 1G of bonding fingers 310a are connected to terminals 310c of the package that provide exterior interconnects for the package. Similarly, each of the second group 2G of bonding fingers 320a are connected to terminals 320c of the package that provide exterior interconnects for the package. Inter-layer vias 310b, 320b (shown collectively as vias V1 of FIG. 19) are used to interconnect the bonding fingers 310a, 320a and corresponding terminals 310c, 320c. The inter-layer vias are formed in the substrate 300 of the connecting board. Passivation layer 335 is formed on surfaces of the substrate 300 to protect underlying circuitry and components. Via V2 can optionally be included, and passes directly through the substrate 300, as a conduit for conducting heat away from the chip die to be mounted on the die pad 330. A power ring and ground ring 327 is also included for providing power and ground voltages to the chip die. Returning to FIG. 18, the bonding fingers 310a of the first group 1G are positioned along a first guide line GL1. The bonding fingers 320a of the second group 2G are positioned along a second guide line GL2. The second line guide line GL2 is spaced apart from the first guide line GL1, for example at a position that is closer to the die pad region 330 than the first guide line GL1. In this example, the guide lines GL1, GL2 are in the shape of arc segment that are elliptical, parabolic, or circular. However, other configurations of guide line shapes are equally applicable to the present invention. In this example, the first guide line GL1 and second guide line GL2 are discontinuous, as they do not intersect at the location of the bonding regions 310a(m) and 320a(1), which service adjacent bonding pads of a die inserted in the die region 300.

The bonding fingers 310a, 320a are shaped by patterning and/or etching of the substrate such that their long axes are oriented toward the corresponding bonding pads of the die. This leads to more efficient and more reliable bonding, especially in the case of ultrasonic bonding techniques, as described above.

Figure 20:
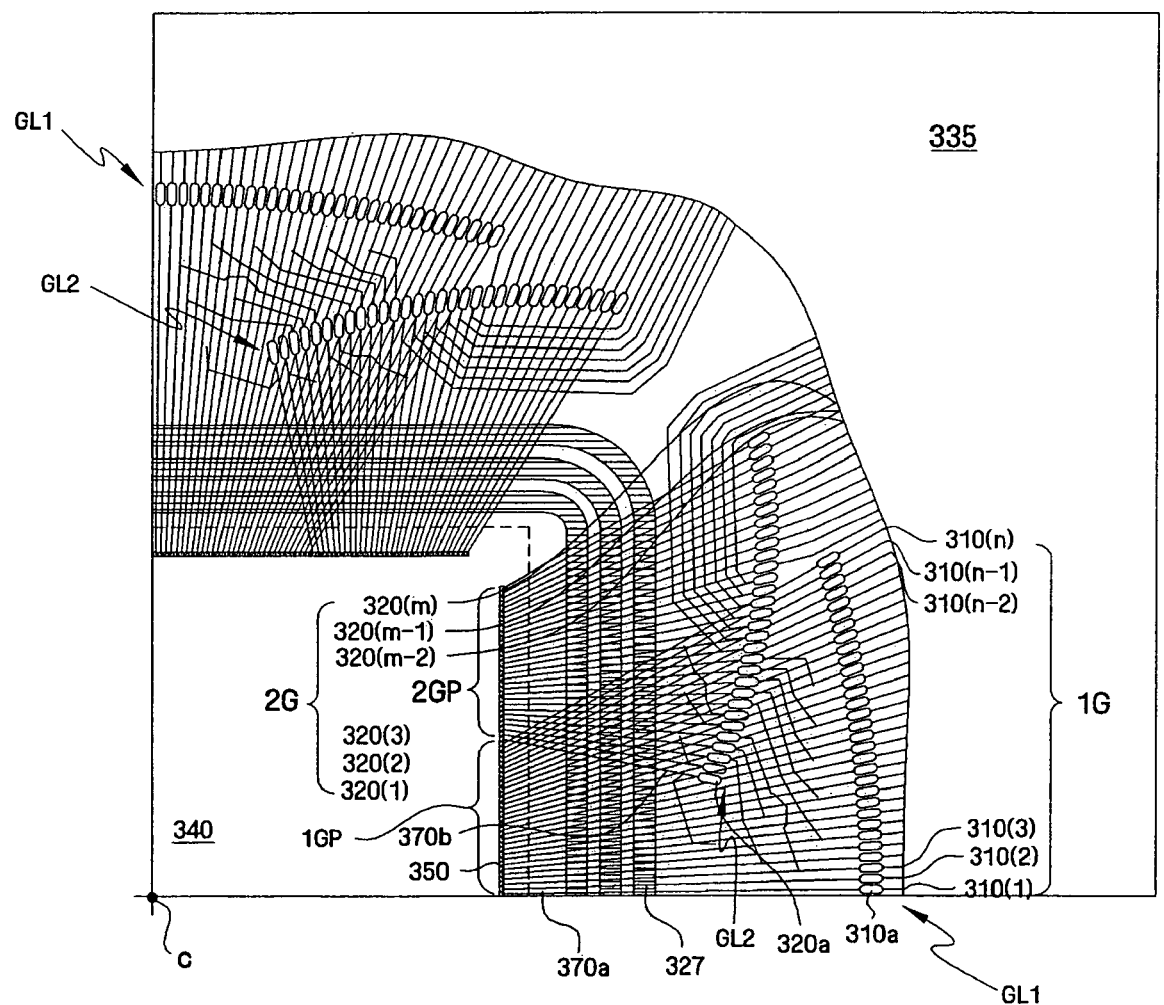
FIG. 20 is a top view of the first quadrant of the substrate and bonding fingers of the BGA of FIGS. 17-19 bonded to a die, in accordance with the present invention.

FIG. 20 is a top view of the first quadrant of the substrate and bonding fingers of the BGA of FIGS. 17-19 bonded to a die, in accordance with the present invention. The die 340 and bonding fingers 310a, 320a are bonded using conductive bonding wires 370a, 370b, such as gold or copper wire. It can be seen that the bonding fingers 310a of the first group 1G of leads lie along guide line GL1, and that the bonding wire 370a of the first via 310(1) of the first group 1G has a bonding angle of about 0 degrees, while the wire 370a of the outermost via 310(n) of the first group 1G has a bonding angle that is approaching the maximum acceptable bonding angle, for example about 30 degrees. It can also be seen that the bonding fingers 320(a) of the second group 2G of leads lie along guide line GL2, and that the bonding wire 370b of the first via 320(1) of the second group 2G has a bonding angle of about 0 degrees, and in this example, actually has a negative bonding angle of about −10 degrees, while the bonding wire 370b of the outermost lead 320(m) of the second group 2G has a bonding angle that is below the maximum acceptable bonding angle of 30 degrees. Thus, a discontinuity exists between the bonding angle of the last vias/bonding finger 310(n) of the first group 1G, which has a bonding angle of about 30 degrees, and the first via/bonding finger 320(1) of the second group, which has a bonding angle of about −10 degrees.

As in the lead frame embodiments described above, in order to accomplish wire bonding in the present substrate-based configuration, the wires 370a used to bond the first via group 310 are made to have a higher loop height than the wires 370b used to bond the second via group 320. This prevents shorting of the wires 370a, 370b for those leads of the first and second groups 1G, 2G that overlap.

In this manner, all leads of the first group 1G and the second group 2G have bonding fingers that are positioned relative to their corresponding bonding pads to lie within the maximum acceptable bonding angle of the package/die combination. The need for applying the corner rule to the chip die is thus eliminated, and maximum use of bonding pads on the die can be realized, and the die can thus be made to have a smaller area. At the same time, the leads are also oriented such that the longitudinal axis of the segment on which the bonding region is placed on the lead is directed toward the corresponding bonding pad, in a "face-to-face" configuration, which leads to a stronger wire-lead bond, as described above.

Figure 21:
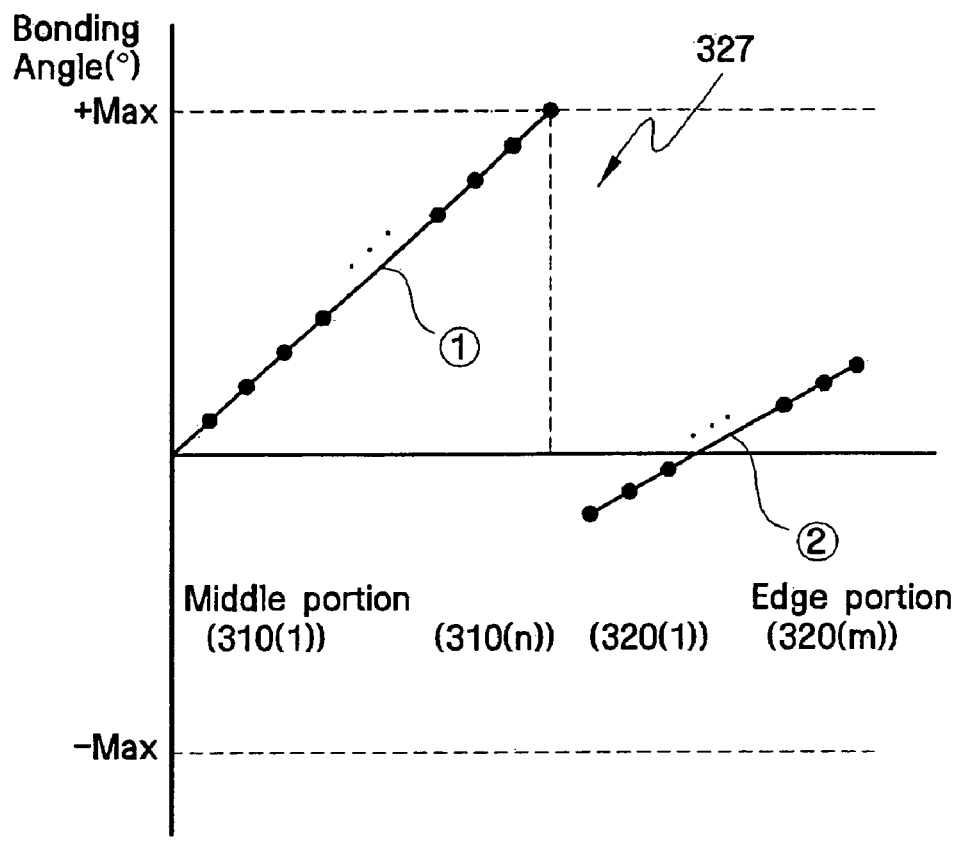
FIG. 21 is a chart of bonding angles for bonding wires of the first group of bonding fingers and for bonding wires of the second group of bonding fingers for the substrate of the BGA of FIG. 20, in accordance with the present invention.

FIG. 21 is a chart of bonding angles for bonding wires of the first group of bonding fingers and for bonding wires of the second group of bonding fingers for the substrate of the BGA of FIG. 20, in accordance with the present invention. Chart 1 of FIG. 21 graphically depicts the incremental increase in bonding angle from an angle of near zero degrees for bonding the first bonding finger 310a(1) of the first group 1G, and incrementally progressing to an angle at or below the maximum acceptable bonding angle MAX for the last bonding finger 310a(n) of the first group 1G. The next adjacent bonding finger is the bonding finger that is to be attached to the next adjacent bonding pad in the row of bonding pads of the die, namely the first bonding finger 320a(1) of the second group 2G (see Chart 2) has a bonding angle that is well within the acceptable range, and in fact has a bonding angle that is of a sign that is opposite that of bonding finger 310a(n). From there, the bonding angles of the second group of bonding fingers 2G incrementally progress back toward a positive value, and the last bonding finger 320a(m) of the second group of leads 2G has a bonding angle that is well within the maximum acceptable value MAX. The chart of bonding angles thus demonstrates a discontinuity 127 between the bonding angles of the leads of the first group (see chart 1) and the bonding angles of the adjacent leads of the second group (see chart 2).

Figure 22:
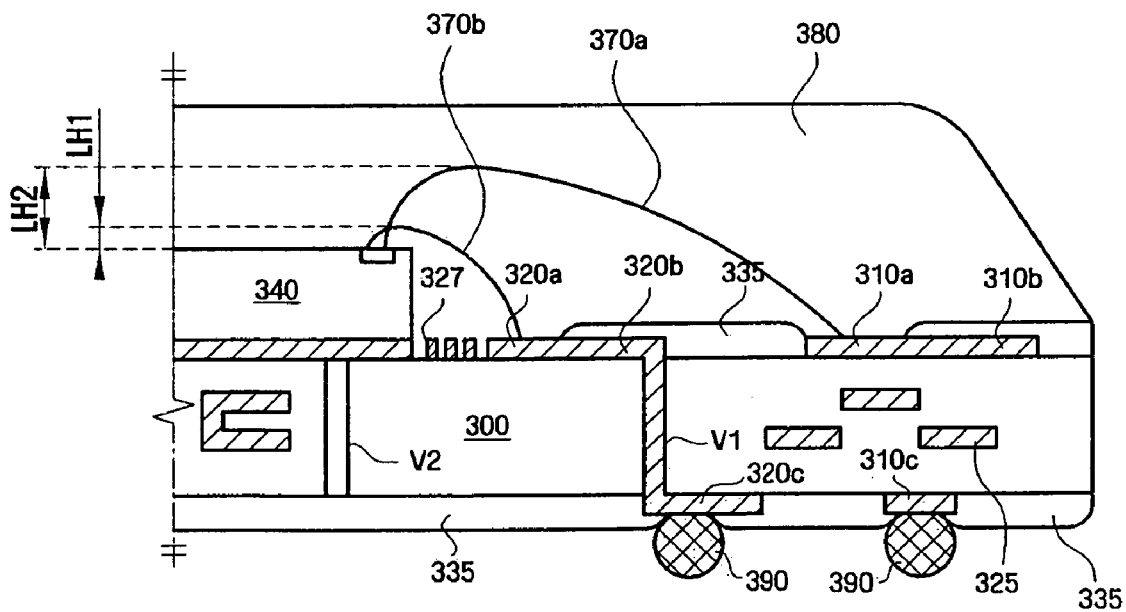
FIG. 22 is a cross-sectional view of the completed package of the bonded BGA of FIG. 20, in accordance with the present invention.

FIG. 22 is a cross-sectional view of the completed package of the bonded BGA of FIG. 20, in accordance with the present invention. The BGA includes a mold compound 380 is applied to an upper surface of the substrate 300 of FIG. 19, to which is mounted the chip die 340 bonded to the bonding fingers 320a, 320b of the first and second groups 1G, 2G, by bonding wires 370a, 370b. The first group 370a of bonding wires has a higher loop height LH2, than the loop height LH1 of the second group of bonding wires 370b, in order to avoid shorting between the wires 370a, 370b. Ball structures 390 are applied to the exposed terminals or ball lands 310c, 320c to provide external terminals for the package.

Figure 23:
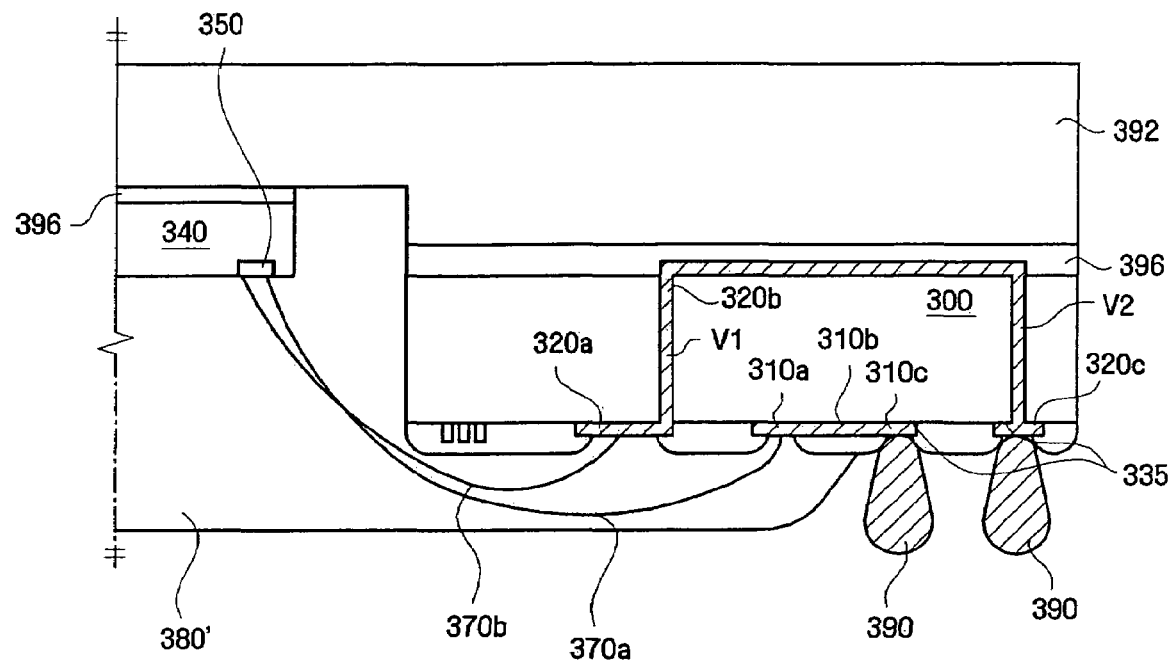
FIG. 23 is a cross-sectional view of an alternative embodiment of a completed package of a bonded BGA, in accordance with the present invention.

FIG. 23 is a cross-sectional view of an alternative embodiment of a completed package of a bonded BGA, in accordance with the present invention. In this embodiment, a large heat sink 392 is applied to an undersurface of the chip die 340, which is bonded to the heat sink via heat-conductive adhesive 396. The bonding substrate or circuit board 300 is similarly mounted to the heat sink 392, and surrounds the chip die 340, as described above. The first and second bonding fingers 310a, 320a of the substrate 300 are bonded to bonding pads of the chip die 340 by corresponding bonding wires 370a, 370b in the manner described above. The BGA includes a mold compound 380' that is applied to a surface of the substrate 300 opposite the heat sink 392, to which is mounted the chip die 340 bonded to the bonding fingers 320a, 320b of the first and second groups 1G, 2G, by bonding wires 370a, 370b. The first group 370a of bonding wires has a higher loop height LH2, than the loop height LH1 of the second group of bonding wires 370b, in order to avoid shorting between the wires 370a, 370b. Ball structures 390 are applied to the exposed terminals or ball lands 310c, 320c to provide external terminals for the package.

Figure 24A:
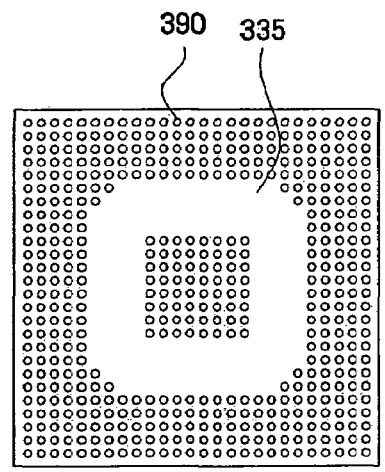
FIGS. 24a, 24b, and 24c are bottom views of various BGA packages, in accordance with the present invention.
Figure 24B:
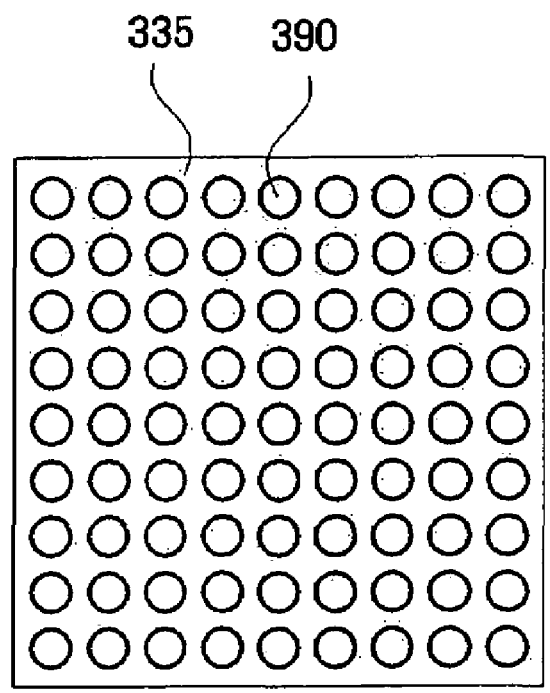
Figure 24C:
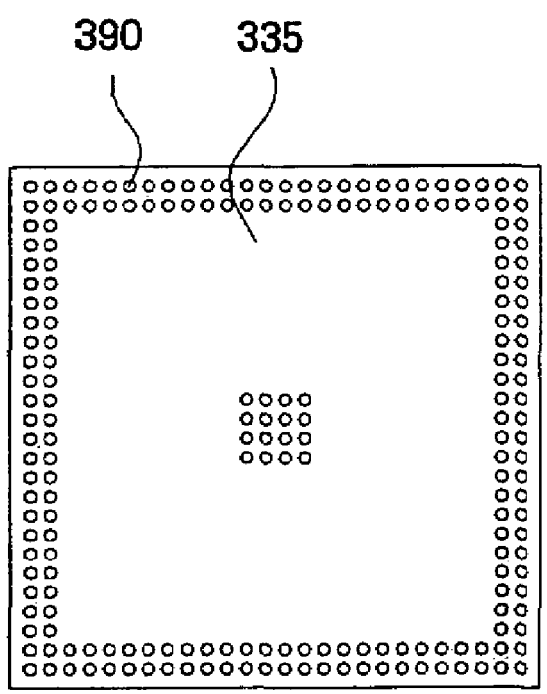

FIGS. 24a, 24b, and 24c are bottom views of various BGA packages, in accordance with the present invention. Each embodiment includes a passivation layer 335 through which are mounted a plurality of balls 390, formed, for example, of solder or gold material. The balls 390 are formed according to conventional approaches, including the conventional mounting method, the reflow method, the screen printing method, or the photolithography method. In FIG. 24a, the balls 390 are relatively small and include several rows along the perimeter and several rows in a central portion of the chip package. In FIG. 24b, the balls 390 are relatively large and cover the entire undersurface of the package. In FIG. 24c, the balls 390 are relatively small and include a couple of rows along the perimeter and limited rows in a central portion of the chip package.

A typical packaging process for a lead-frame-based package such as the QFP package described above with respect to FIG. 11 involves the well-known steps of taping, sawing, die attach, wire bonding, molding, lead trim, lead plating, and lead formation. A typical packaging process for a substrate-based package such as the BGA package described above with respect to FIG. 22 involves the well-known steps of taping, sawing, die attach, wire bonding, molding, ball attach and ball singulation.

During the step of wire bonding, in accordance with the present invention, a high-speed wire stitching machine is employed. A capillary of gold wire is attached to the target bonding pad by a torching method in which a molten ball of material from a first end the end of the wire is deposited on the bonding pad and the wire is shaped or looped to extend to the bonding region of the lead of the lead frame or the bonding finger of the conductive path on the substrate. The second end of the wire is rapidly bonded to the bonding region by a stitch bond, for example using ultrasonic bonding techniques. Following bonding, the wire is "tailed off", or broken, and the next bonding procedure begins.

During the molding step, for example in the case of a lead-frame-based package, EMC compound is introduced into the component area through a mold gate at a high pressure, for example 2 tons/mm$^2$. As the material fills the mold, air is vented through corners of the mold. After curing of the mold, the leads external to the lead frame are trimmed, for example using a Dambar process. The external leads are then plated for example using SnPb or SnAgCu materials. During the forming process, the exposed, trimmed, and plated leads are stamped into an appropriate shape for soldering to a circuit board or substrate.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A connecting system for a semiconductor device package comprising:
    a plurality of bonding regions about a die region, the bonding regions each corresponding to a designated one of a plurality of bonding pads of a die mounted in the die region, a first set of the bonding regions positioned along a first guide line and corresponding to a first plurality of adjacent bonding pads at a central region of an edge of the die, a second set of the bonding regions positioned along a second guide line and corresponding to a second plurality of adjacent bonding pads at a corner region of the die, the first and second guide lines being discontinuous with respect to each other, wherein a line extending from one of the first set of bonding regions to a corresponding bonding pad of the first plurality of adjacent bonding pads is at a first bonding angle that is greater than bonding angles of lines extending from other bonding regions of the first set of the bonding regions to corresponding bonding pads of the first plurality of adjacent bonding pads, and wherein a line extending from each of the second set of the bonding regions to a corresponding bonding pad of the second plurality of adjacent bonding pads is at a second bonding angle that is less than or equal to the first bonding angle; and
    a plurality of external terminals, each connected to a corresponding one of the plurality of bonding regions.

2. The connecting system of claim 1 wherein the bonding regions comprise bonding fingers.

3. The connecting system of claim 2 wherein the bonding fingers are formed on an outer surface of a multiple-layered substrate or multiple-layered circuit board, and further comprising a plurality of conductive vias that connect each of the plurality of bonding fingers to each corresponding one of the plurality of external terminals.

4. The connecting system of claim 1 wherein the bonding regions comprise bonding tips of a lead frame and further comprising conductive leads coupled between each bonding region and a corresponding one of the plurality of external terminals.

5. The connecting system of claim 4 wherein the conductive leads extend in an inward direction past the bonding tips into the die region to serve as a support for a die mounted in the die region.

6. The connecting system of claim 4 wherein at least one of the conductive leads coupled to the second set of bonding regions includes a first inflection point that redirects the lead toward the central region of the edge of a die mounted in the die region and away from the corner region of the die.

7. The connecting system of claim 6 wherein the at least one of the conductive leads coupled to the second set of bonding regions further includes a second inflection point closer to the die region than the first inflection point that redirects the lead to be oriented in a direction toward the bonding pad corresponding to the bonding region of the conductive lead.

8. The connecting system of claim 1 wherein the first and second guide lines comprise at least one of a line segment, a curve segment, a sinuous curve segment, a spline curve, an arc segment, a parabolic arc segment, an elliptic arc segment, and a circular arc segment.

9. The connecting system of claim 1 wherein:
    a change in bonding angle between each one of the corresponding first plurality of adjacent bonding pads and first set of bonding regions is incremental,
    a change in bonding angle between each one of the corresponding second plurality of adjacent bonding pads and second set of bonding regions is incremental, and
    a change in bonding angle between a last one of the corresponding first plurality of adjacent bonding pads and first set of bonding regions and a first one of the corresponding second plurality of adjacent bonding pads and second set of bonding regions is discontinuous relative to the incremental change.

10. The connecting system of claim 9 wherein the bonding angles of the lines between the corresponding first plurality of adjacent bonding pads and the first set of bonding regions and the bonding angles of the lines between the corresponding second plurality of adjacent bonding pads and the second set of bonding regions are not greater than a maximum acceptable bonding angle.

11. The connecting system of claim 1 wherein the first and second guide lines are positioned at different distances from the die region.

12. The connecting system of claim 11 wherein the second guide line is closer to the die region than the first guide line.

13. The connecting system of claim 1 wherein the bonding regions are elongated and have long axes that are oriented in a direction toward the corresponding bonding pad of a die mounted in the die region.

14. The connecting system of claim 1 wherein the first set of bonding regions positioned along the first guide line and the second set of bonding regions positioned along the second guide line are located in the connecting system to correspond with an octant of the die region.

15. The connecting system of claim 14 wherein each octant has a corresponding first set of bonding regions positioned along the first guide line and a corresponding second set of bonding regions positioned along the second guide line.

16. The connecting system of claim 1 wherein the semiconductor device package comprises one of a ball grid array (BGA), a quad flat package (QFP) and a quad flat non-lead package (QFN).

* * * * *